(12) United States Patent
Frost et al.

(10) Patent No.: US 8,443,136 B2
(45) Date of Patent: May 14, 2013

(54) METHOD AND APPARATUS FOR PROTECTING DATA USING VARIABLE SIZE PAGE STRIPES IN A FLASH-BASED STORAGE SYSTEM

(75) Inventors: Holloway H. Frost, Houston, TX (US); James A. Fuxa, Houston, TX (US); Charles J. Camp, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/971,286

(22) Filed: Dec. 17, 2010

(65) Prior Publication Data
US 2011/0087855 A1   Apr. 14, 2011

Related U.S. Application Data

(62) Division of application No. 12/554,891, filed on Sep. 5, 2009, now Pat. No. 7,856,528.

(60) Provisional application No. 61/232,913, filed on Aug. 11, 2009.

(51) Int. Cl.
*G06F 12/00* (2006.01)

(52) U.S. Cl.
USPC ........... 711/103; 711/165; 711/203; 711/209; 365/185.11

(58) Field of Classification Search .................. 711/103, 711/165, 203, 209; 365/185.11
See application file for complete search history.

(56) References Cited

U.S. PATENT DOCUMENTS

| | | | |
|---|---|---|---|
| 5,170,400 | A | 12/1992 | Dotson |
| 5,875,456 | A | 2/1999 | Stallmo et al. |
| 6,041,423 | A | 3/2000 | Tsukerman |
| 6,052,759 | A | 4/2000 | Stallmo et al. |
| 6,098,119 | A | 8/2000 | Surugucchi et al. |
| 6,115,837 | A | 9/2000 | Nguyen et al. |
| 6,158,017 | A | 12/2000 | Han et al. |
| 6,282,039 | B1 | 8/2001 | Bartlett |
| 6,282,670 | B1 | 8/2001 | Rezaul Islam et al. |
| 6,311,251 | B1 | 10/2001 | Merritt et al. |
| 6,347,359 | B1 | 2/2002 | Smith et al. |

(Continued)

OTHER PUBLICATIONS

Fusion-io. "Taming the Power Hungry Data Center." Fusion-io White Paper, 2007, [retrieved from the Internet on Aug. 28, 2009 using <URL: http://www.fusionio.com/PDFs/Whitepaper_Green.pdf>].

(Continued)

*Primary Examiner* — Reginald Bragdon
*Assistant Examiner* — Gurtej Bansal
(74) *Attorney, Agent, or Firm* — Locke Lord LLP

(57) ABSTRACT

Methods and apparatuses for enhanced protection of data stored in a FLASH memory system involve a controller capable of using variable size page stripes in the memory system. The controller is configured to store data such that each page stripe comprises a plurality of data pages, with each data page in the page stripe being stored in a different FLASH memory chip. The controller is also configured to maintain one or more buffers containing information reflecting blocks of memory within the FLASH memory chips that have been erased and are available for information storage, and to dynamically determine the number of data pages to be included in a page stripe based on the information in the one or more buffers such that a first page stripe and a second page stripe can have different numbers of data pages.

11 Claims, 20 Drawing Sheets

U.S. PATENT DOCUMENTS

| | | | |
|---|---|---|---|
| 6,516,425 | B1 | 2/2003 | Belhadj et al. |
| 6,718,434 | B2 | 4/2004 | Veitch et al. |
| 6,718,437 | B2 | 4/2004 | Don et al. |
| 6,795,895 | B2 | 9/2004 | Merkey et al. |
| 6,867,999 | B2 | 3/2005 | Yoo et al. |
| 6,938,123 | B2 | 8/2005 | Willis |
| 7,024,586 | B2 | 4/2006 | Kleiman et al. |
| 7,076,606 | B2 | 7/2006 | Orsley |
| 7,120,826 | B2 | 10/2006 | Fore et al. |
| 7,134,066 | B2 | 11/2006 | Hassner et al. |
| 7,162,678 | B2 | 1/2007 | Saliba |
| 7,173,852 | B2 | 2/2007 | Gorobets et al. |
| 7,257,674 | B2 | 8/2007 | Kobayashi et al. |
| 7,299,401 | B2 | 11/2007 | Fukuda |
| 7,328,307 | B2 | 2/2008 | Hoogterp |
| 7,409,492 | B2 | 8/2008 | Tanaka et al. |
| 7,433,998 | B2 | 10/2008 | Dawkins |
| 7,437,600 | B2 | 10/2008 | Tachikawa |
| 7,454,639 | B2 | 11/2008 | Jain et al. |
| 7,502,886 | B1 | 3/2009 | Kowalchik et al. |
| 7,519,624 | B2 | 4/2009 | Korupolu et al. |
| 7,577,866 | B1 | 8/2009 | Fan et al. |
| 7,710,777 | B1 | 5/2010 | Montierth et al. |
| 7,721,146 | B2 | 5/2010 | Polisetti et al. |
| 7,734,865 | B2 | 6/2010 | Tanaka et al. |
| 7,890,795 | B1* | 2/2011 | Madnani et al. ............... 714/6.2 |
| 2003/0120864 | A1* | 6/2003 | Lee et al. ....................... 711/114 |
| 2005/0086575 | A1 | 4/2005 | Hassner et al. |
| 2005/0144363 | A1 | 6/2005 | Sinclair |
| 2005/0144516 | A1* | 6/2005 | Gonzalez et al. ................. 714/8 |
| 2006/0184723 | A1 | 8/2006 | Sinclair et al. |
| 2006/0200481 | A1 | 9/2006 | Goyan |
| 2007/0204128 | A1 | 8/2007 | Lee et al. |
| 2007/0232906 | A1 | 10/2007 | Alexandru |
| 2007/0294570 | A1 | 12/2007 | Polisetti et al. |
| 2008/0016435 | A1 | 1/2008 | Goel |
| 2008/0052451 | A1 | 2/2008 | Pua |
| 2008/0059707 | A1 | 3/2008 | Makineni et al. |
| 2008/0098158 | A1 | 4/2008 | Kitahara |
| 2008/0177956 | A1 | 7/2008 | Peddle |
| 2008/0282024 | A1 | 11/2008 | Biswas |
| 2008/0288436 | A1 | 11/2008 | Priya |
| 2009/0089534 | A1 | 4/2009 | Zohar et al. |
| 2009/0172335 | A1 | 7/2009 | Kulkarni et al. |
| 2009/0193174 | A1 | 7/2009 | Reid |
| 2009/0193314 | A1 | 7/2009 | Melliar-Smith et al. |
| 2009/0240873 | A1 | 9/2009 | Yu et al. |
| 2009/0327840 | A1* | 12/2009 | Moshayedi ................... 714/773 |
| 2010/0005228 | A1 | 1/2010 | Fukutomi et al. |
| 2010/0017650 | A1 | 1/2010 | Chin et al. |
| 2010/0083040 | A1 | 4/2010 | Voigt et al. |
| 2010/0107021 | A1 | 4/2010 | Nagadomi et al. |

OTHER PUBLICATIONS

Fusion-io. "Fusion-io's Solid State Storage—A New Standard for Class Reliability." Fusion-io White Paper, 2007, [retrieved from the Internet on Aug. 28, 2009 using <URL: http://www.fusionio.com/PDFs/Whitepaper_Solidstatestorage2.pdf>].

Simitci, H. and Reed, D., University of Illinois Department of Computer Science. "Adaptive Disk Striping for Parallel Input/Output." Proceedings of the Seventh Goddard Conference on Mass Storage Systems and Technologies, Mar. 1999, pp. 88-102, IEEE Computer Society.

Chang, L. and Kuo, T., National Taiwan University. "An Adaptive Striping Architecture for Flash Memory Storage Systems of Embedded Systems." Proceedings of the 8th IEEE Real-Time and Embedded Technology and Applications Symposium, Sep. 25-27, 2002, IEEE Computer Society.

Agrawal, N., Prabhakaran, V., Wobber, T., Davis, J., Manasse, M. and Panigrahy, R., University of Wisconsin-Madison "Design Tradeoffs for SSD Performance." Proceedings of the USENIX Technical Conference, Jun. 2008, [retrieved from the Internet on Aug. 28, 2009 using <URL: http://research.microsoft.com/pubs/63596/USENIX-08-SSD.pdf>].

Zertal, S., University of Versailles. "A Reliability Enhancing Mechanism for a Large Flash Embedded Satellite Storage System." Proceedings of the Third International Conference on Systems, 2008, pp. 345-350, IEEE Computer Society.

Shin, J., Xia, Z., Xu, N., Gao, R., Cai, X., Maeng, S. and Hsu, F. "FTL Design Exploration in Reconfigurable High-Performance SSD for Server Applications." Proceedings of the 23rd International Conference on Supercomputing, Jun. 8-12, 2009, New York.

Wu, C., National Taiwan University. "A Time-Predictable System Initialization Design for Huge-Capacity Flash-Memory Storage Systems." Proceedings of the 6th IEEE/ACM/IFIP International Conference on Hardware/Software Codesign, Sep. 19-24, 2008, pp. 13-18, ACM, Atlanta.

Pariseau, B. "A Technology Deep-Dive with Fusion-io." IT Knowledge Exchange, Mar. 3, 2009, [retrieved from the Internet on Sep. 10, 2009 using <URL: http://itknowledgeexchange.techtarget.com/storage-soup/a-technology-deep-dive-with-fusion-io/>].

Hutsell, W., Bowen, J. and Ekker, N. "Flash Solid-State Disk Reliability." Texas Memory Systems White Paper, Nov. 2008.

Chang, Yu-Bin and Chang, Li-Pin, National Chiao-Tung University. "A Self-Balancing Striping Scheme for NAND-Flash Storage Systems." 23rd ACM Symposium on Applied Computing '08. Mar. 16-20, 2008, pp. 1715-1719, Brazil.

Chen, F., Koufaty, D. and Zhang, X. "Understanding Intrinsic Characteristics and System Implications of Flash Memory based Solid State Drives." SIGMetrics/Performance '09, Jun. 15-19, 2009, pp. 181-192, Seattle, Washington.

Lee, Sang-Won., Moon, B. and Park, C. "Advances in Flash Memory SSD Technology for Enterprise Database Applications." SIGMOD '09, Jun. 29-Jul. 2, 2009, pp. 863-870, Providence, Rhode Island.

Dholakia, A., Eleftheriou, E., Hu, Xiao-Yu, Iliadis, I., Menon, J., and Rao, KK. "Analysis of a New Intra-Disk Redundancy Scheme for High-Reliability RAID Storage Systems in the Presence of Unrecoverable Errors." SIGMetrics/Performance '06, Jun. 26-30, 2006, pp. 373-373, France.

Wu, Chin-Hsien, Kuo Tei-Wei, and Chang, Li-Pin. "The Design of Efficient Initialization and Crash Recovery for Log-based File Systems Over Flash Memory." ACM Transactions on Storage, vol. 2, No. 4, Nov. 2006, pp. 449-467, New York, New York.

Norman, L., "RamSan-20 PCIe Flash SSD: Expanding the role of Flash in the enterprise," Texas Memory Systems White Paper, May 2009.

Hutsell, W., "An In-depth Look at the RamSan-620 Flash Solid State Disk," Texas Memory Systems White Paper, Jul. 2009.

Hutsell, W., "An In-depth Look at the RamSan-500 Cached Flash Solid State Disk," Texas Memory Systems White Paper, Mar. 2008.

Dholakia, A., Eleftheriou, E., Hu, X.Y., Iliadis, I., Menon, J., and Rao, K., "A New Intra-disk Redundancy Scheme for High-Reliability RAID Storage Systems in the Presence of Unrecoverable Errors," ACM Transactions on Storage, vol. 4, No. 1, Article 1, May 2008.

Dholakia, A., Eleftheriou, E., Hu, X.Y., Iliadis, I., Menon, J., and Rao, K., "Analysis of a New Intra-Disk Redundancy Scheme for High-Reliability RAID Storage Systems in the Presence of Unrecoverable Errors," SIGMetrics/Performance '06, Jun. 26-30, 2006, pp. 373-374, France.

Son, Y.S., International Search Report for International Patent Application No. PCT/US2010/045129, Korean Intellectual Property Office, dated Mar. 4, 2011.

Son, Y.S., Written Opinion for International Patent Application No. PCT/US2010/045129, Korean Intellectual Property Office, dated Mar. 4, 2011.

Greenan, K. et al., "Building Flexible, Fault-Tolerant Flash-based Storage Systems", In: Proceedings of the 25th Workshop on Hot Topics in System Dependability, Jun. 2009.

Center for Advanced Defense Studies. "Technical Overview: Fusion-io." Center for Advanced Defense Studies, published at least as early as Aug. 28, 2009, [retrieved from the Internet on Aug. 28, 2009 using <URL: http://eti.c4ads.org/sites/default/files/PC029_FusionIO.pdf>].

"Understanding RAID level-5EE." IBM Systems Software Information Center, published at least as early as Sep. 10, 2009, [retrieved from the Internet on Sep. 10, 2009 using <URL: http://publib.boulder.ibm.com/infocenter/eserver/v1r2/index.jsp?topic=/diricinfo/fqy0_craid5ee.html/>].

"Non-standard RAID levels." Wikipedia, published at least as early as Sep. 10, 2009, [retrieved from the Internet on Sep. 10, 2009 using <URL: http://en.wikipedia.org/wiki/Non-standard_RAID_levels/>].

"RAID." Wikipedia, published at least as early as Sep. 10, 2009, [retrieved from the Internet on Sep. 10, 2009 using <URL: http://en.wikipedia.org/wiki/RAID>].

"Electric double-layer capacitor," Wikipedia, published at least as early as Aug. 5, 2009, [retrieved from the Internet on Aug. 5, 2009 using <URL: http://en.wikipedia.org/wiki/Ultracapacitors>].

* cited by examiner

Data Protection Page

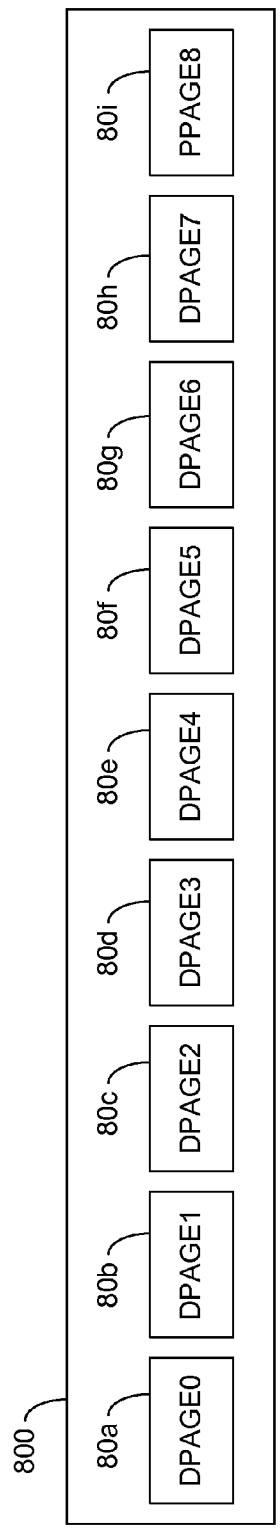
Figure 8A
Figure 8B

| | | | | | | | | | |
|---|---|---|---|---|---|---|---|---|---|
| DPAGE6 90g | DPAGE7 90h | DPAGE8 90i | PPAGE9 90j | DPAGE0 90a | DPAGE1 90b | DPAGE2 90c | DPAGE3 90d | DPAGE4 90e | DPAGE5 90f |
| LANE0 | LANE1 | LANE2 | LANE3 | LANE4 | LANE5 | LANE6 | LANE7 | LANE8 | LANE9 |

Figure 9C

| | | | | | | | | | |
|---|---|---|---|---|---|---|---|---|---|
| DPAGE5 90f | DPAGE6 90g | DPAGE7 90h | DPAGE8 90i | PPAGE9 90j | DPAGE0 90a | DPAGE1 90b | DPAGE2 90c | DPAGE3 90d | DPAGE4 90e |
| LANE0 | LANE1 | LANE2 | LANE3 | LANE4 | LANE5 | LANE6 | LANE7 | LANE8 | LANE9 |

Figure 9D

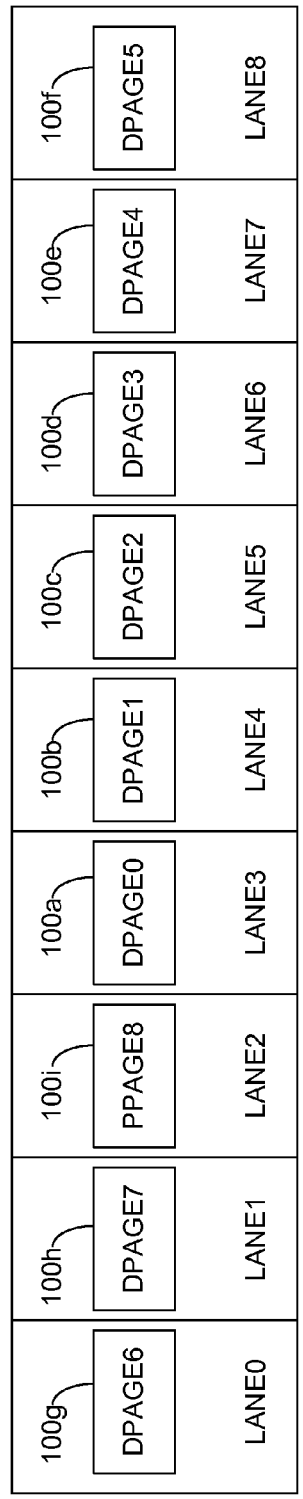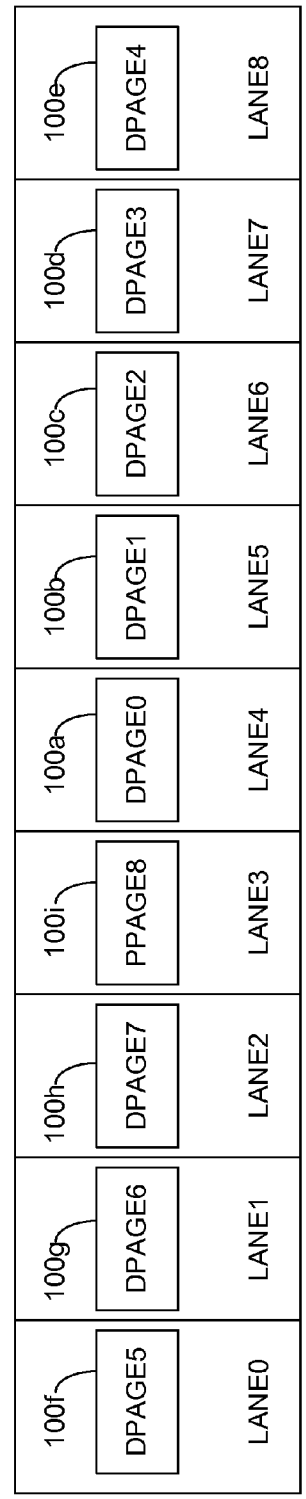

FFFFF = 0000000000000.....0000
FFFFE = 1111111111111.....1111
FFFFD = 10101010101010.......1010
Defined Data Identifiers

Figure 15A

| LBA | Value |
|---|---|
| LBA0 | Actual Physical Address Identifier |
| LBA1 | Actual Physical Address Identifier |
| LBA2 | Actual Physical Address Identifier |
| LBA3 | Actual Physical Address Identifier |
| LBA4 | |
| LBA5 | |
| ... | FFFFF |
| LBA55 | Actual Physical Address Identifier |
| ... | |
| ... | Actual Physical Address Identifier |
| ... | FFFFF |
| LBA500 | Actual Physical Address Identifier |

Figure 15B

METHOD AND APPARATUS FOR PROTECTING DATA USING VARIABLE SIZE PAGE STRIPES IN A FLASH-BASED STORAGE SYSTEM

CROSS REFERENCE TO RELATED APPLICATIONS

This application for patent is a divisional of U.S. Non-Provisional Application Ser. No. 12/554,891 (U.S. Pat. No. 7,856,528), entitled "Method and Apparatus for Protecting Data Using Variable Size Page Stripes in a FLASH-Based Storage System," filed Sep. 5, 2009, which claims priority to U.S. Provisional Application Ser. No. 61/232,913, entitled "Method and Apparatus for Efficient and Enhanced Protection, Storage and Retrieval of Data Stored in Multiple FLASH Storage Locations," filed Aug. 11, 2009, both of the above applications being hereby incorporated herein by reference. This application is also related in subject matter to: (1) commonly-assigned U.S. Non-Provisional application Ser. No. 12/554,888 (U.S. Pat. No. 8,176,360), entitled "Method and Apparatus for Addressing Actual or Predicted Failures in a FLASH-Based Storage System," filed Sep. 5, 2009; and (2) commonly-assigned U.S. Non-Provisional Application Ser. No. 12/554,892 (U.S. Pat. No. 8,176,284), entitled "FLASH-Based Memory System with Variable Length Page Stripes Including Data Protection Information," filed Sep. 5, 2009.

STATEMENT REGARDING FEDERALLY SPONSORED RESEARCH

Not applicable.

REFERENCE TO APPENDIX

Not applicable.

BACKGROUND OF THE INVENTION

1. Field of the Invention

This disclosure relates generally to methods and apparatus for improving the ability of a memory storage system to efficiently and effectively protect, store and retrieve data stored in multiple storage locations.

2. Description of the Related Art

In certain memory storage systems data is stored in multiple storage locations. For example, in some such systems, multiple individual hard disks or memory chips are used to store data and the data stored in one or more of the storage devices is associated with data stored in other storage devices in such a manner that data errors in one or more storage devices can be detected and possibly corrected. One such approach is to store a given quantity of data across multiple storage locations by dividing the data into data portions of equal length—the individual data portions sometimes being referred to as "data pages"—and then storing the data pages in multiple storage locations such that one data page is stored in each storage device. In connection with this approach, a further storage device may be used to store a page of data protection information, where a given page of data protection information is associated with a specific set of data pages stored in the multiple storage locations. In some instances, the set of data pages in the multiple locations that is used to store associated data is referred to as a "data stripe" or "Page Stripe."

In conventional systems, the length of all of the data stripes used in the system is the same. Thus, in such systems, all of the data stored in the system is divided into data stripes of the same length, with each data stripe consisting of the same number of pages, and with each data stripe being stored in the same number of memory locations. Also, in such system, each data stripe conventionally utilizes the same form of data protection and the data protection information for each data stripe is determined in the same way.

In conventional systems as described above, if there is a full or complete failure of the structure associated with a given memory location (e.g., the specific memory device associated with that location fails), the data protection page for a given data stripe can often be used to reconstruct the data in the data page that was stored in the failed memory location. Using the reconstructed data, the data for the entire data stripe may be reconstructed. In such systems, when a storage location in a system as described fails and the data correction page is used to reconstruct the data associated with the failed storage location, the reconstructed data is stored in a reserve or back-up storage location that takes the place of the failed storage location within the system such that the data stripe that was associated with the failed memory location is reconstructed in substantially the same form. Thus, the reconstructed data stripe consists of the same number of pages, is stored in the same number of memory locations, and utilizes the same form of data protection as the data stripe that was associated with the failed storage location.

While the conventional approach described above can beneficially detect and respond to the failure of a memory storage location within a memory storage system, it requires the availability of a reserve or back-up storage location to take the place of the failed storage location. Such reserve or back-up locations can be costly and/or inefficient to provide and/or maintain and/or are not always available.

SUMMARY OF THE INVENTION

The disclosed embodiments are directed to methods and apparatuses for providing efficient and enhanced protection of data stored in a FLASH memory system. In some embodiments, the methods and apparatuses involve a system controller for a plurality of FLASH memory devices in the FLASH memory system that is capable of using variable size page stripes for the FLASH memory devices. The system controller is configured to store data such that each page stripe comprises a plurality of pages of data, with each page of data in the page stripe being stored in a FLASH memory device that is different from the FLASH memory devices in which the other pages of data in the page stripe are stored. The system controller is also configured to maintain one or more buffers containing information reflecting blocks of memory within the FLASH memory devices that have been erased and are available for storage of information, and to dynamically determine the number of pages to be included in a page stripe based on the information contained in the one or more buffers such that a first page stripe can have a first number of pages of data and a second page stripe can have a second number of pages of data, where the first number is different from the second number.

In some embodiments, the system controller is configured to write data to the FLASH memory devices in a striped fashion using data stripes, with each data stripe including a group of data collections. The system controller writes the data in a manner such that each data stripe includes a group of data collections and an associated set of data protection information, each data collection is written into a different FLASH memory device from the other data collections and the data protection information in the data stripe, and the controller can, on a group by group basis, adjust the number of data collections within each data stripe.

In some embodiments, the system controller is configured to receive WRITE requests from an external host device, each WRITE request including a data item and a logical memory address associated with the data item. For each WRITE request, the system controller translates the logical memory address to a physical memory address and writes the data item to a physical memory location corresponding to the physical memory address. The system controller then associates a number of data items received in a plurality of WRITE requests with each other to form a group of received data items, generates data protection information for each group of data items, writes the data protection information to a physical memory location, and translates the received logical memory addresses for the data items in the group. The controller thereafter selects the physical memory location for storage of the data protection information such that each of the data items is stored in a physical memory location within a different FLASH memory device from the FLASH memory devices in which the other data items and the data protection information for the group of received data items are stored. The system controller can also dynamically select the number of data items used to form each group such that the number of data items in one group of received data items can differ from the number of data items in a second group of received data items.

BRIEF DESCRIPTION OF THE DRAWINGS

The foregoing and other advantages of the disclosed embodiments will become apparent from the following detailed description and upon reference to the drawings, wherein:

FIGS. 8A and 8B illustrate another exemplary Page Stripe and another exemplary storage arrangement therefor in accordance with the present disclosure;

FIGS. 9A-9D illustrate additional exemplary Page Stripes and additional exemplary storage arrangements therefor in accordance with the present disclosure;

FIGS. 10A-10D illustrate further exemplary Page Stripes and further exemplary storage arrangements therefor in accordance with the present disclosure;

FIGS. 15A and 15B illustrate an exemplary Logical-to-Physical Translation Table having Data Identifiers therein in accordance with the present disclosure.

DETAILED DESCRIPTION

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims.

Figure 1:
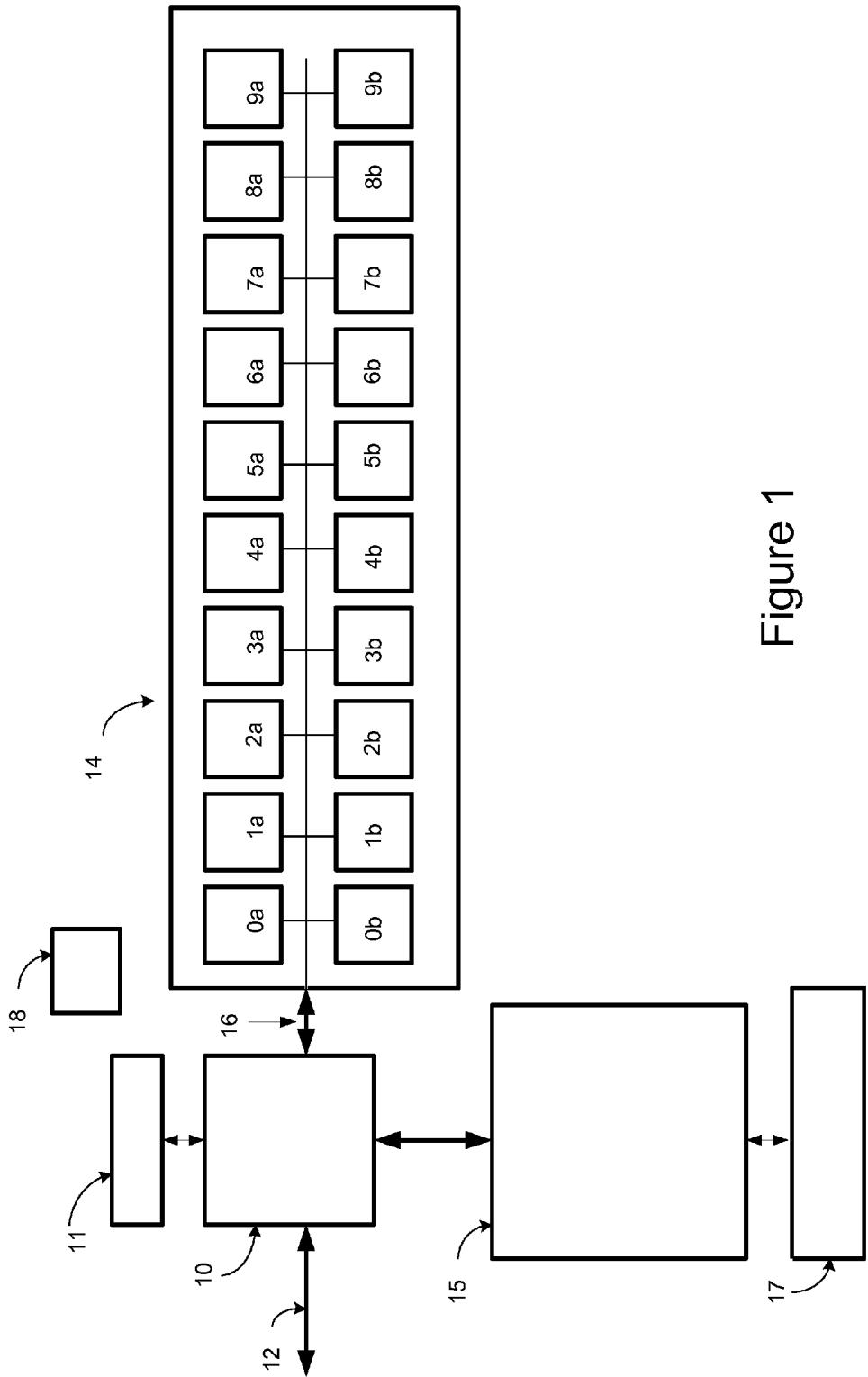
FIG. 1 illustrates an exemplary FLASH memory storage system in accordance with the present disclosure.

Exemplary Memory System:

Turning to the drawings and, in particular, to FIG. 1 a memory storage system 100 in accordance with certain teachings of the present disclosure is illustrated. While it can be constructed in various ways, in the example of FIG. 1, the memory storage system is constructed on a single multi-layer printed circuit board.

The exemplary illustrated memory storage system 100 includes: a FLASH controller 10; FLASH controller memory 11; a CPU 15; CPU memory 17; an external communication bus 12 used to communicate information to the FLASH controller 10; a FLASH memory storage array 14; and an internal communication bus 16 that enables communications between the FLASH controller 10 and the FLASH memory storage array 14. In the illustrated example, the components of the memory storage system 100 are mounted to the same printed circuit board. Such mounting may be accomplished through, for example, surface mounting techniques, through-hole techniques, through the use of sockets and socket-mounts and/or other mounting techniques.

The FLASH controller 10 may take many forms. In the example of FIG. 1, the FLASH controller 10 is a field programmable gate array (FPGA) that, during start-up of the system is programmed and configured by the CPU 15.

Like the controller, the controller memory 11 may take many forms. In the exemplary embodiment of FIG. 1, the controller memory 11 takes the form of random access memory and in particular DDR2 RAM memory.

The communication bus 12 can be any acceptable data bus for communicating memory access requests between a host device (such as a personal computer, a router, etc.) and the memory system 100. The communication bus 12 can also use any acceptable data communications protocols.

In general operation, the FLASH controller 10 receives requests via communication bus 12 to read data stored in the FLASH memory storage array 14 and/or to store data in the FLASH memory storage array 14. The FLASH controller 10 responds to these requests either by accessing the FLASH memory storage array 14 to read or write the requested data from or into the storage array 14 in accordance with the request, by accessing a memory cache (not illustrated) associated with the storage array 14, or by performing a read or write operation through the use of a Data Identifier as described in more detail below.

The FLASH memory storage array 14 may take many forms. In the illustrated example, the FLASH memory storage array 14 is formed from twenty individually addressable FLASH memory storage devices divided into groups of two (0*a*, 0*b*), (1*a*, 1*b*), (2*a*, 2*b*) through (9*a*, 9*b*). In the illustrated example, each of the FLASH memory storage devices 0*a*-9*b* takes the form of a board-mounted FLASH memory chip, such as, for example, a 64 Gigabit (Gb) Single Level Cell (SLC) NAND flash memory chip.

The internal communication bus 16 can take any form that enables the communications described herein. In the example of FIG. 1, this bus 16 is formed from ten individual eight-bit communication buses 0-9 (not individually illustrated), each arranged to enable communication between the systems controller 10 and each of the groups of two memory storage devices 0*a*-9*b*. Thus, for example, communication bus 0 enables communications between the FLASH controller 10 and the group comprising memory devices 0*a* and 0*b*, and communication bus 4 enables communications between the systems controller 10 and the memory devices 4*a* and 4*b*.

Referring to FIG. 1, an on-board ultra-capacitor 18 may also be provided and configured to receive charge during intervals when power is supplied to the FLASH memory system 100 and to provide power for a limited time to the components making up the FLASH memory system 100 whenever applied power is removed or drops below the power level provided by the ultra-capacitor. The purpose of the ultra-capacitor is to provide power for limited operation of the FLASH memory system 100 upon the failure of power to the system. In the event of a power loss, the ultra-capacitor will automatically engage and provide power to most or all components of the FLASH memory system 100. In the FLASH system of FIG. 1, the ultra-capacitor is sized to provide adequate power to allow the system to store into the FLASH memory array 14 any data that may be retained in the RAM storage device 11 at the time of power loss or power failure, as well as any other volatile information that may be necessary or useful for proper board operation. In that manner, the overall FLASH system 100 acts as a non-volatile memory system, even though it utilizes various volatile memory components. Alternate embodiments are envisioned where multiple ultra-capacitors at various distributed locations across the printed circuit board and/or a single ultra-capacitor bank is used to provide the described back-up power. As used herein, the term ultra-capacitor is any capacitor with sufficiently high capacitance to provide the back-up power required to perform the functions described above that is adequately sized to fit on a printed circuit board and be used in a system, such as system 100.

The system 100 uses an addressing scheme to allow the FLASH controller 10 to access specific memory locations within the memory array 14. For purposes of explanation, this addressing scheme will be discussed in the context of a WRITE request, although it will be understood that the same addressing scheme is and can be used for other requests, such as READ requests.

In general, the FLASH controller 10 will receive a WRITE request from a host device that contains both: (i) data to be stored in the memory system 100 and (ii) an indication of the memory address where the host device would like for the data to be stored. The WRITE request may also include an indication of the amount (or size) of the data to be transferred. In one embodiment, the system is constructed such that the amount of data (or the size of each WRITE request) is fixed at the size of a single FLASH memory page. In the exemplary embodiment of FIG. 1, this corresponds to 4 KBytes of information. In such an embodiment, the address provided by the host device can correspond to the address of a Page within a logical address space.

In the system 100 of FIG. 1, the address received by the FLASH controller 10 does not refer to an actual physical location within the memory array 14. Instead, the address received by the Flash Controller 10 from the host device is a Logical Block Address (or "LBA") because it refers to a logical address, rather than to any specific physical location within the memory array 14. The concept of Logical Block Addressing as used in the system 100 of FIG. 1 is discussed in more detail below.

In the system 100 of FIG. 1, the memory array 14 comprises a collection of individual FLASH memory storage chips. A specific physical addressing scheme is used to allow access to the various physical memory locations within the FLASH memory chips 0*a*-9*b*. In the embodiment of FIG. 1, this physical addressing scheme is based on the physical organization and layout of the memory array 14.

Referring to FIG. 1, as noted earlier, the physical memory chips 0*a*-9*b* that make up the memory array 14 are divided into ten groups of two chips. For purposes of the physical addressing scheme, each group of two chips forms a "Lane," also sometimes referred to as a "Channel," such that there are ten Lanes or Channels within the memory array 14 (LANE0-LANE9). LANE0 corresponds to chips 0*a* and 0*b*; LANE1 to chips 1*a* and 1*b* and so on, with LANE9 corresponding to chips 9*a* and 9*b*. In the embodiment of FIG. 1, each of the individual Lanes has associated with it one of the individual eight-bit buses 0-9 mentioned earlier to enable the FLASH controller to communicate information across the Lane. Thus, by directing its communications to one of the specific communication buses 0-9, the FLASH controller 10 can direct its communications to one of the Lanes of memory chips. Because each communication bus 0-9 for a given Lane is independent of the communication buses for the other Lanes, the controller 10 can issue commands and send or receive data across the various communication buses at the same time such that the system controller can access the memory chips corresponding to the individual Lanes at, or very nearly at, the same time.

In the addressing scheme for the memory system 100 of FIG. 1, each Lane enables communications with one of two physical memory chips at any given time. Thus, for example, data provided across communication bus 0 can enable communications with either chip 0*a* or chip 0*b*. In the embodiment of FIG. 1, for Lane 0 as an example, the FLASH controller 10 controls eight individual chip enable lines (four for chip 0*a* and four for chip 0*b*) so that each chip and its corresponding internal hardware resources may be addressed individually. The assertion of a single chip enable line results in communications with one chip and one chip enable ("CE") resource within that chip.

In the embodiment of FIG. 1, the physical memory locations within each of the FLASH memory chips are divided into physical locations that can be addressed and/or identified through the use of one or more of: Chip Enables ("CEs," generally described above); Dice (multiple individual die); Planes; Blocks; and Pages. This exemplary addressing scheme is generally illustrated in FIGS. 2A and 2B.

Figure 2A:
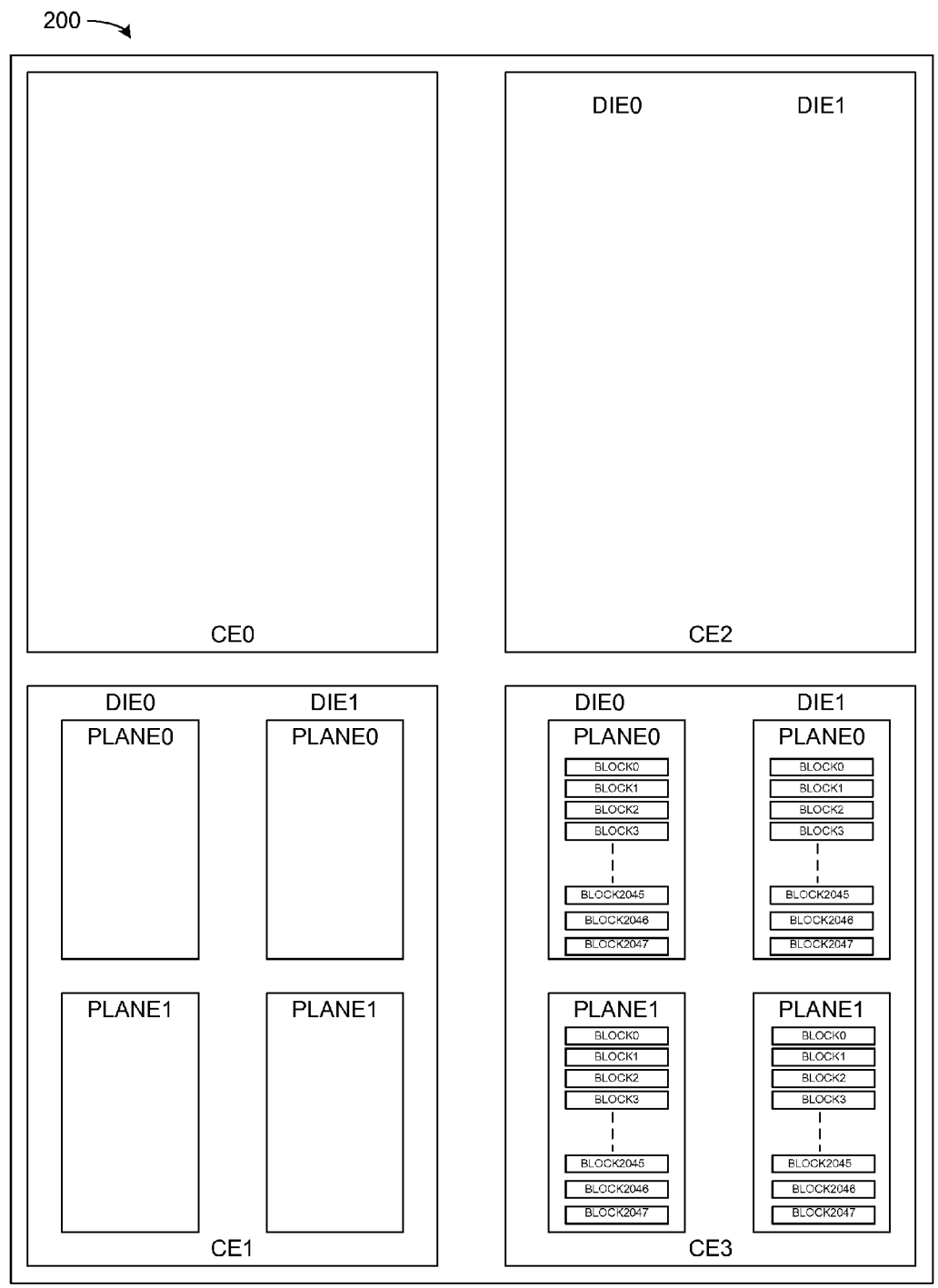
FIGS. 2A and 2B illustrate an exemplary arrangement of physical memory within a FLASH memory chip in accordance with the present disclosure.
Figure 2B:
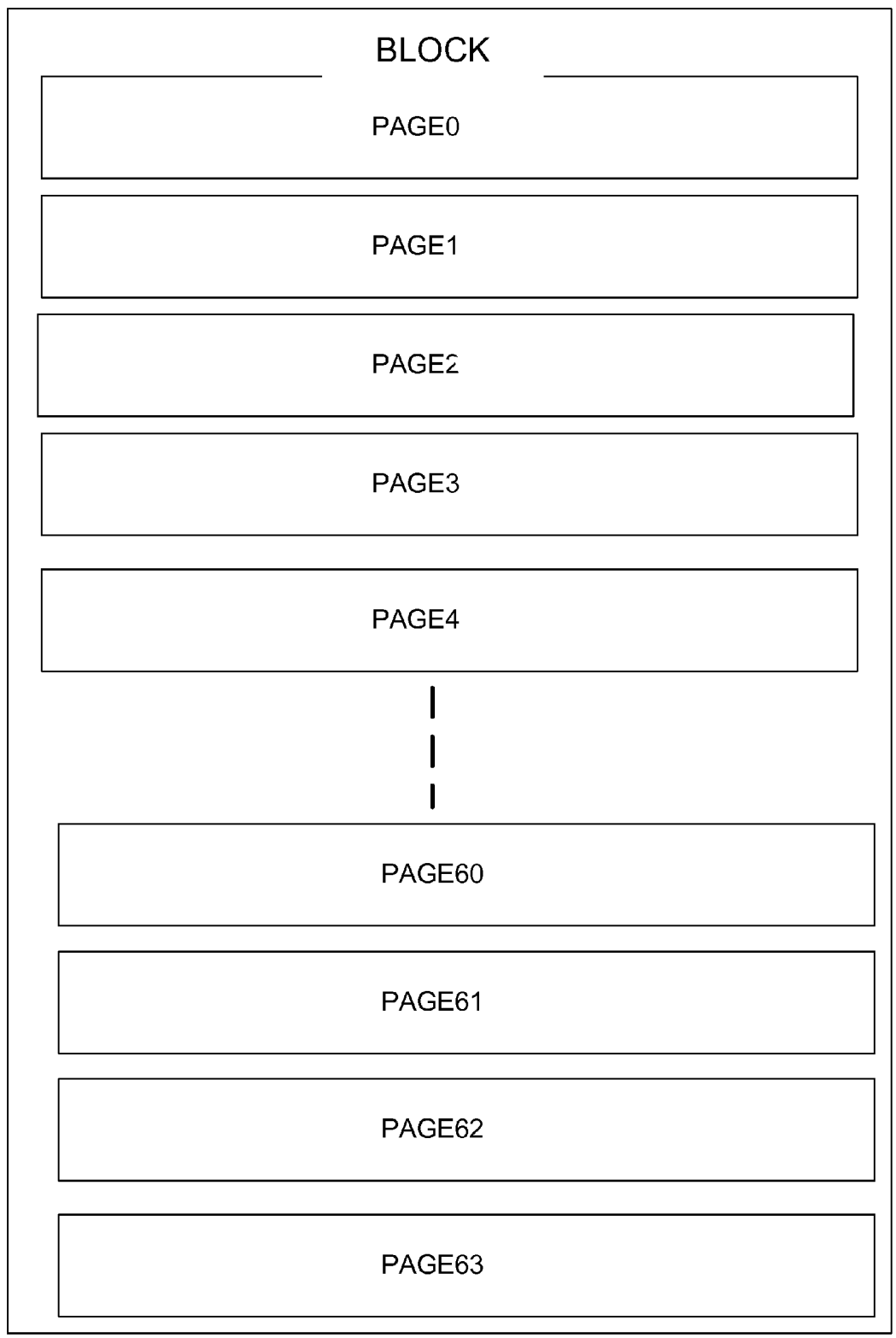

FIGS. 2A and 2B generally illustrate the physical memory 200 within each of the individual FLASH memory chips 0*a*-9*b* of FIG. 1. Referring to FIGS. 2A and 2B, it may be noted that, at one level, the physical memory 200 within the device may be divided into four high level groupings, where each grouping has associated with it an individual Chip Enable (or "CE") line. In the example of FIG. 2, the physical memory 200 of each FLASH chip is divided into four groupings of Chip Enables (CE0, CE1, CE2 and CE3) and each Chip Enable would have a separate CE line. During an addressing state, the activation of one of the four CE lines will enable access to or from memory locations within the group of memory locations associated with the asserted CE line.

In the embodiment of FIGS. 2A and 2B, each CE group of memory locations is further divided into Dice (multiple individual die), Pages, Blocks and Planes.

The division of the physical memory into Dice is generally related to the manner in which the structures internal to the chip are formed. In the exemplary embodiment of FIG. 2A, each Chip Enable includes two Dice (DIE0 and DIE1) which are illustrated for CE0-CE3.

In the addressing scheme of FIGS. 2A and 2B, a Page is the smallest individually addressable data unit. In the exemplary system, each Page of data has a specific length which in the example is a data length corresponding to 4 KB of data plus 128 additional bytes used as described in more detail below. In the embodiment of FIG. 1, data is written into or read from the memory array 14 on a Page-by-Page basis.

In the system of FIGS. 2A and 2B, the various Pages of data are grouped together to form "Blocks." In general, a Block is a collection of pages that are associated with one another, typically in a physical manner. The physical association is such that the Block is the smallest group of FLASH memory locations that can be erased at any given time. In the embodiment of FIGS. 2A and 2B, each Block includes 64 Pages of data. This is reflected generally in FIG. 2B.

When dealing with FLASH memory, an ERASE operation involves the placement of all of the memory locations that are subject to the erase operation in a particular logical state, corresponding to a specific physical state of the memory locations. In the embodiment of FIG. 1, the ERASE operation is performed on a Block-by-Block basis and the performance of an ERASE operation of a given block places all of the memory locations within the Block into a logical "1" state, corresponding to a state where there is no or relatively low charge stored within the storage devices associated with each memory location. Thus, while data may be read from or written to the memory array 14 on a Page-by-Page basis, the memory locations can be erased only on a Block-by-Block basis in the embodiment shown.

In the arrangement of FIGS. 2A and 2B, the Blocks of data are grouped together to form "Planes." Each Plane represents a collection of Blocks that, because of the physical layout of the FLASH memory chips, are physically associated with one another and that utilize common circuitry for the performance of various operations. In the example of FIGS. 2A and 2B, each Die includes two Planes and each Plane comprises 2048 Blocks of data. In FIG. 2A, the Blocks within the Planes are illustrated for CE3.

In the illustrated example, the various Blocks of data that form a given Plane all utilize common circuitry within the individual chips 0*a*-9*b* to perform certain operations, including READ and WRITE operations. Thus, for example, each of the Pages of Data within an exemplary Plane (e.g., PLANE0 of DIE0 of CE3) will be associated with some specific input/output circuitry that includes an Input/Output (I/O) Buffer. The I/O Buffer is a buffer that is sized to store at least one Page of data. When data is to be written into a specific Page in a Block, a Page of data is first written to the I/O Buffer for the Plane, and the Page of data is then written into the memory locations associated with the specific Page. Similarly, when a specific Page of data is to be read from a location within the Plane, the Page of data is first retrieved from the specific Page to be accessed and placed in the I/O Buffer for the Plane in which the accessed Page resides. If the data was requested in a manner where it would be accessible outside the FLASH chip 200, the data is delivered from the I/O Buffer in the associated Plane to the System Controller 10.

The memory system 100 of FIG. 1 does not generally allow devices external to the system to directly address and access the physical memory locations within the FLASH memory storage array. Instead, the memory system 100 is generally configured to present a single contiguous logical address space to the external devices that may request READ or WRITE access to data stored in the memory array 14. The use of this logical address space allows the system 100 to present a logical address space external to the system 100, such that a host device can write data to or read data from logical addresses within the address space—thus allowing easy access and use of the memory system 100—but also allows the FLASH controller 10 and CPU 15 to control where the data that is associated with the various logical addresses is actually stored in the physical memory locations that make up memory array 14 such that the performance of the system is optimized.

Because the system 100 isolates the logical address space made available to host devices from the physical memory within the array 14, it is not necessary that the size of the physical memory array 14 be equal to the size of the logical address space presented external to the system. In some embodiments it is beneficial to present a logical address space that is less than the total available address space. Such an approach ensures that there is available raw physical memory for system operation, even if data is written to each presented logical address space. For example, in the embodiment of FIG. 1, where the FLASH memory array 14 is formed using 64 Gb FLASH memory chips providing a raw physical memory space of 640 Gb of storage, the system could present a logical address space corresponding to approximately 448 Gb of data storage.

Page Stripes

In the exemplary system of FIG. 1, data is written to the memory array 14 using associated Pages of data known as "Page Stripes." In the illustrated embodiment, a Page Stripe represents a grouping of associated information, stored in a particular manner within the memory array 14.

Page Stripes: Information Content

While the specific information that is stored in a given Page Stripe can vary, in one embodiment, each Page Stripe includes a number of Pages of stored data (typically provided by a host device) and one Page of data used to protect the stored data. While the actual size of a Page Stripe may vary, for purposes of the following discussion an exemplary Page Stripe consisting of nine pages of stored data and one page of data protection information is described.

Figure 3A:
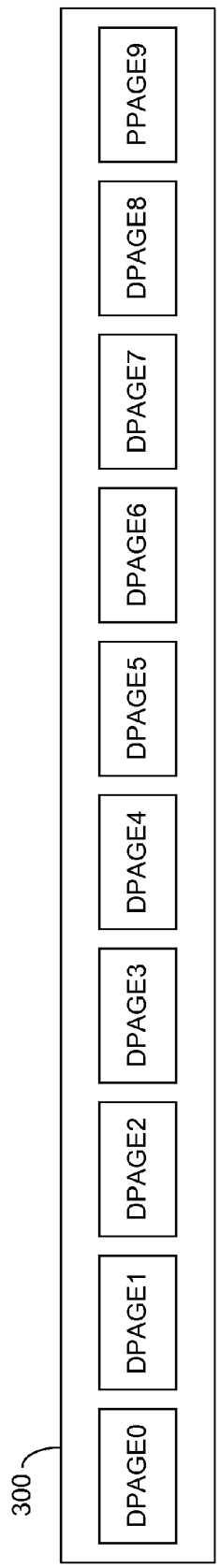
FIGS. 3A-3F illustrate exemplary implementations of Page Stripes in accordance with the present disclosure.

FIG. 3A illustrates an exemplary Page Stripe 300 in accordance with the teachings of the present disclosure. Referring to FIG. 3A, the exemplary Page Stripe consists of nine pages of data, each referred to herein as a "Data Page" (DPAGE0, DPAGE1, DPAGE2 . . . DPAGE8 in the example) and one page of data protection information, referred to herein as a "Data Protection Page" (PPAGE9 in the example).

Figure 4:
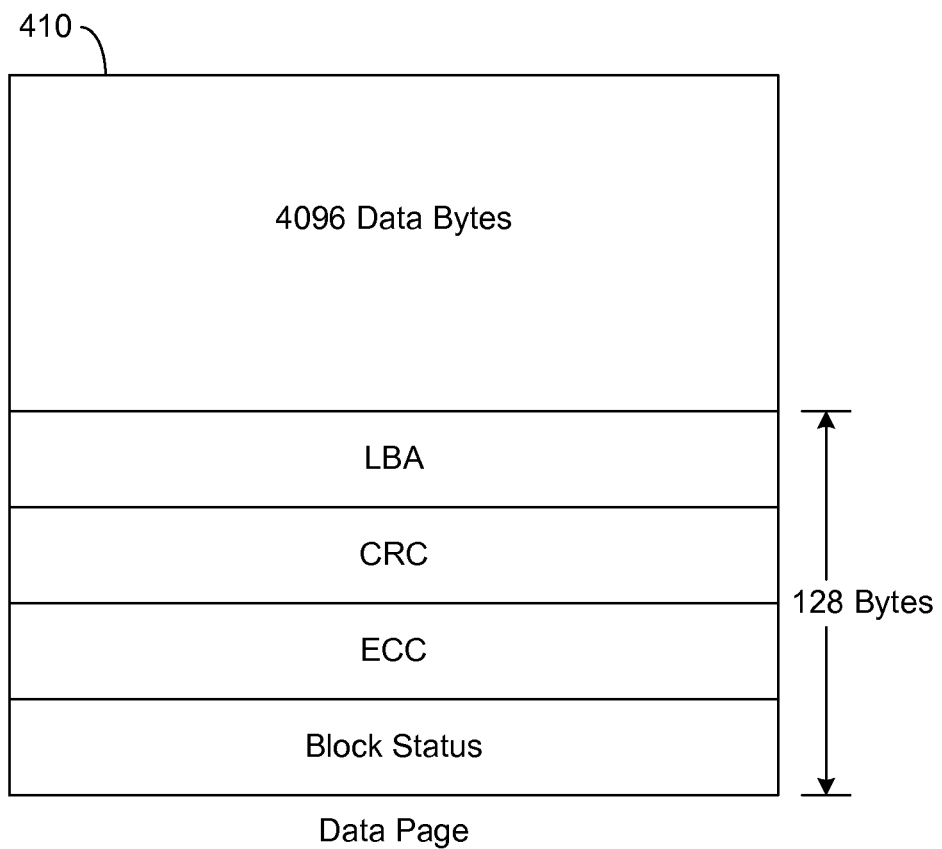
FIG. 4 illustrates an exemplary Data Page in accordance with the present disclosure.

FIG. 4 generally illustrates the format used for each Data Page within the Page Stripe 300. Referring to FIG. 4, an exemplary Data Page 410 is illustrated. The illustrated Data Page 410 includes 4096 bytes of stored data and 128 bytes of additional information that, in the illustrated example, includes a number of bits that provide the Logical Block Address (LBA) corresponding to the specific Data Page at issue; a number of bits that reflect a cyclic redundancy check (CRC) of the combination of the stored data and the stored LBA; and a number of Error Correction Code (ECC) bits calculated, in the illustrated example, using the combination of the stored data bytes, the LBA bits and the CRC bits. In some embodiments, bits of data reflecting the status of the Block in which the illustrated Page is found may also be stored within the Data Page.

In the example of FIG. 4, the LBA information is in the form of four bytes of data, although the length of the LBA address is not critical and can vary.

The CRC data can take many forms and be of variable length and various techniques may be used to determine the CRC data associated with the LBA address stored in the Data Page. In one example, the CRC data comprises a 64-bit value formed by a hashing technique that performs a hash operation on the 4096 data bytes plus the four LBA data bytes to produce a 64-bit CRC hash value.

Various techniques may be used to determine the ECC bits for the stored data and LBA information stored in the Data Page 410.

In one embodiment, the ECC data associated with the stored data and LBA information is calculated using a beneficial technique in which, the ECC data stored in the Data Page comprises thirty-three sixteen-bit ECC segments, with each of thirty-two of the ECC segments being associated with 128 unique bytes of the 4 KByte data area, and a thirty-third ECC segment being associated with the LBA and CRC fields.

Figure 5:
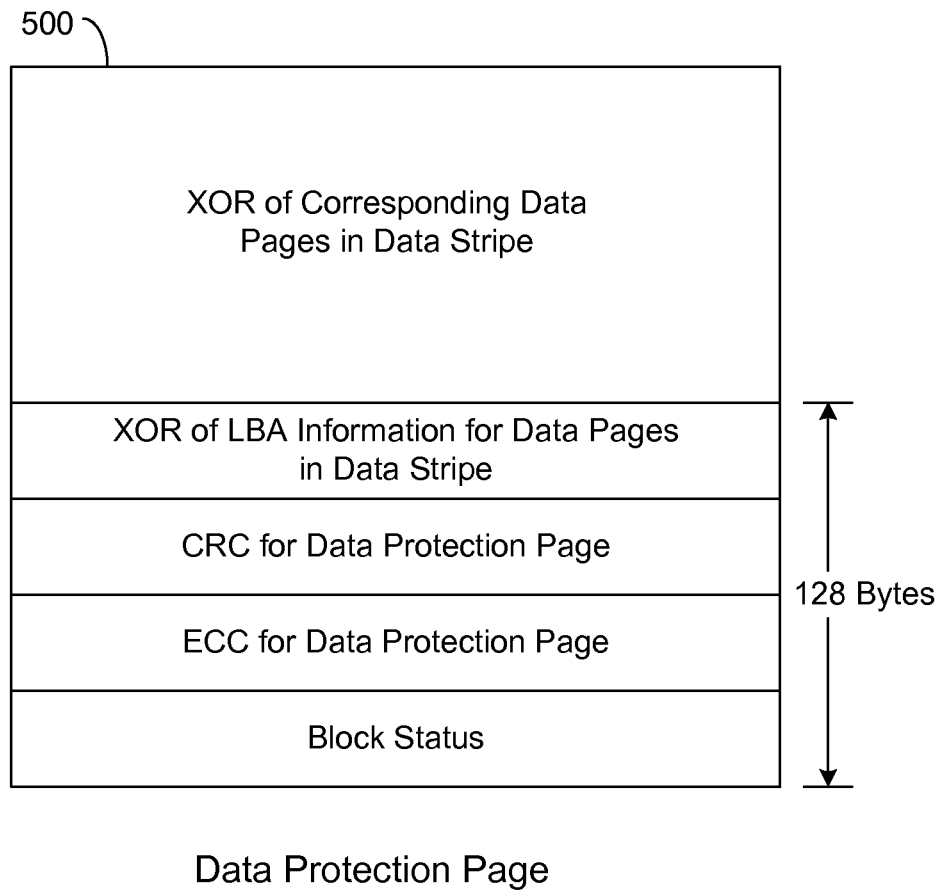
FIG. 5 illustrates an exemplary Data Protection Page in accordance with the present disclosure.

FIG. 5 generally illustrates the form of the information stored in the Data Protection Page of the exemplary Page Stripe 300. Referring to FIG. 5, an exemplary Data Protection Page 500 is illustrated. The data and LBA fields of the Data Protection Page 500 simply contain the bit-by-bit Exclusive Or (XOR) of the corresponding fields in one or more of the associated Data Pages (PAGE0, PAGE1, PAGE2 . . . PAGE8). The ECC and CRC fields for the Data Protection Page 500 are recalculated for the Data Protection Page 500 in a manner identical to that used in the corresponding Data Pages. The XOR calculation used to produce the Data Protection Page can be accomplished using the apparatus of FIG. 6 and/or a software approach.

Figure 6:
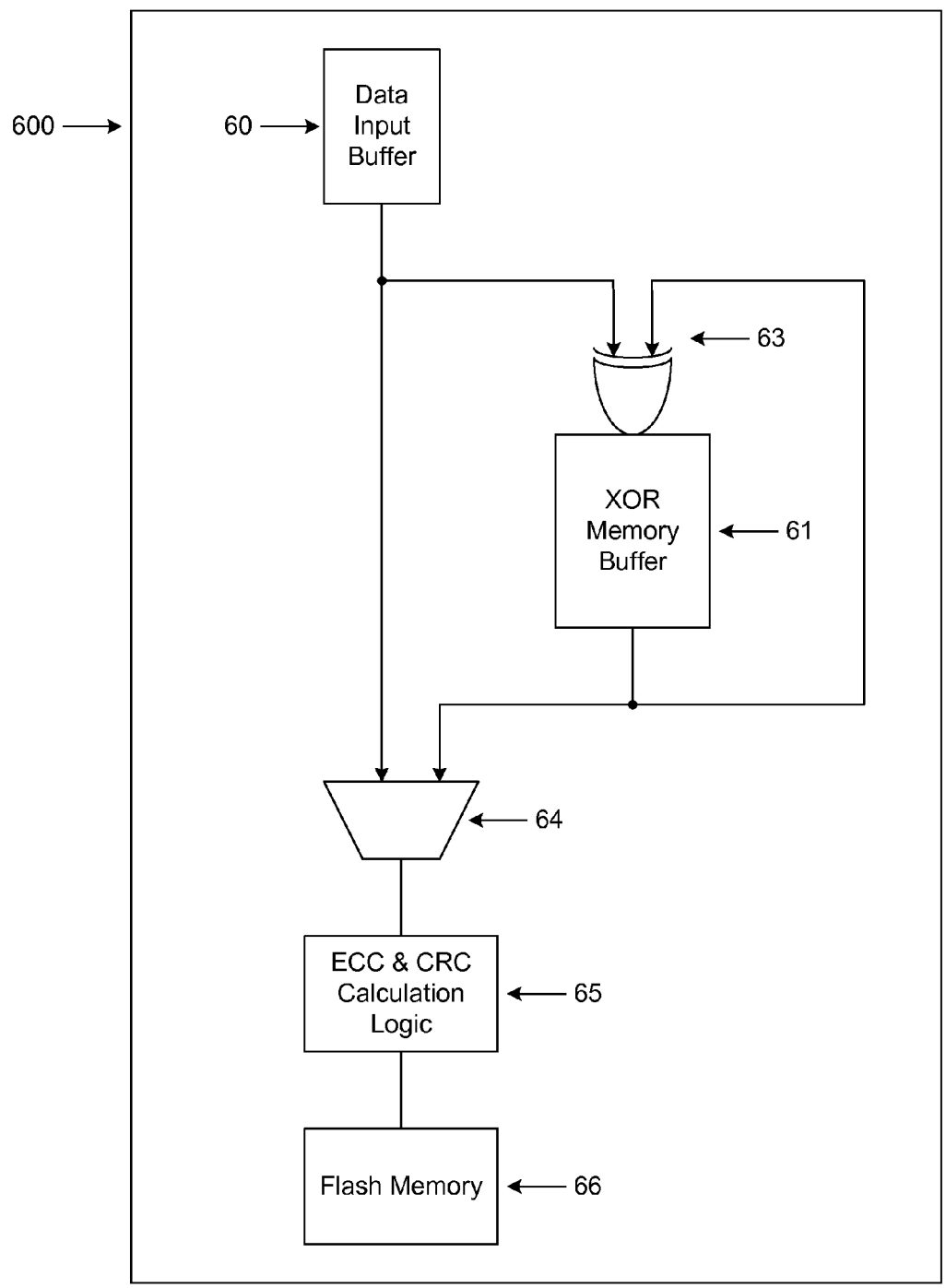
FIG. 6 illustrates an exemplary circuit that can be used to produce a Data Protection Page in accordance with the present disclosure.

Referring to FIG. 6 XOR circuitry 600 is disclosed that includes an input memory buffer 60, an addressable XOR memory buffer 61, a multi-bit XOR circuit/buffer 63 and a multiplexer (MUX) 64. ECC and CRC calculation logic 65 is also illustrated, as is the physical FLASH memory array 66. In the illustrated embodiment, each of the input buffer 60, XOR buffer 61, XOR circuit 63 and MUX 64 operate on a Page of information.

The circuitry 600 of FIG. 6 operates as follows: All data destined for the FLASH memory 66 passes first through input memory buffer 60. If this data is the first Page of a new Page Stripe, the data is copied directly into the addressable XOR memory buffer 61 as it flows into the downstream ECC and CRC calculation logic 66. For the second and subsequent Pages of a Page Stripe, previous data in the addressable XOR memory buffer is unloaded and XORed with new data as the new data is unloaded from the input memory buffer 60. The result is then written back into the addressable XOR memory buffer 61, yielding the XOR of all Data Pages up to and including the current one. This operation is repeated until the data in the addressable XOR memory buffer 61 reflects the XOR of the data in all the Data Pages that make up the Page Stripe at issue, after which the addressable XOR memory buffer 61 is written to FLASH memory. Multiplexer 64 selects between current data and the resulting XOR calculation.

The XOR operation may alternately be performed through the use of software or firmware.

It may be noted that through the use of the Page format described above in connection with FIG. 4 and the use of the Data Protection Page 500 of FIG. 5, the data that is stored in a Page Stripe as described herein is protected through multiple different protection mechanisms. First, the use of the ECC bits in each Data Page allows the correction of any single bit error and the detection of any double bit error within each group of 128 data bytes. ECC also allows the same single-bit error correction and double-bit error detection within the LBA and CRC fields. After ECC checking and correction is performed, the corrected CRC field is used to validate the corrected data. Used together, these two mechanisms allow for the correction of relatively benign errors and the detection of more serious errors using only local "intra-Page" information. Should an uncorrectable error occur in a FLASH Page, the data and LBA information from the failing Page may be reconstructed from the other Pages (including the XOR Data Protection Page) within the same Page Stripe using the information in the Data Protection Page for the Page Stripe. Note that the XOR Data Protection Page for each Page Stripe employs the same local protection mechanisms (ECC and CRC) as every other Data Page within the Page Stripe.

Figure 3B:
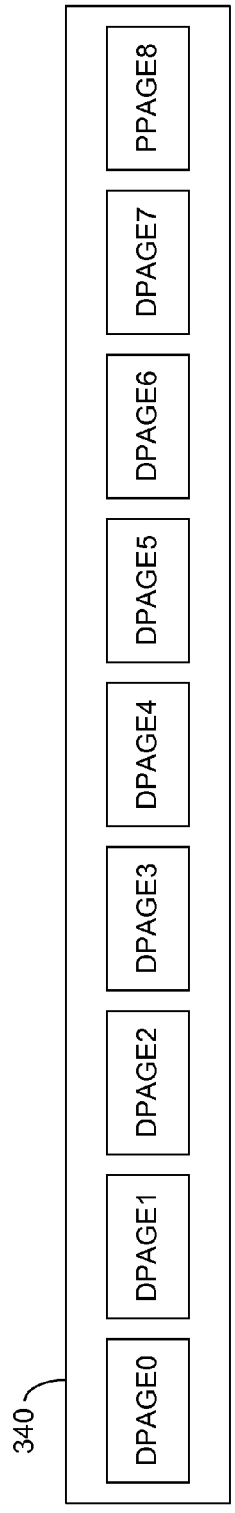

The specific Page Stripe 300 of FIG. 3A is but one example of a Page Stripe in accordance with the teachings of this disclosure. Page Stripes of different sizes and constructions can also be used. One such alternate Page Stripe is reflected in the embodiment of FIG. 3B. FIG. 3B illustrates an alternate Page Stripe 340 that includes only nine total Pages of data with eight of the Pages (DPAGE0-DPAGE7) being Data Pages and one of the Pages (PPAGE8) being a Data Protection Page. In the illustrated embodiment of FIG. 3B, the individual Data Pages (DPAGE0-DPAGE7) are constructed in accordance with the Data Page format of FIG. 4 and the Data Protection Page is of the form reflected in FIG. 5. Because the Page Stripe 340 includes only eight Data Pages, however, the Data Protection Page (PPAGE8) will include the XOR of only eight Data Pages, as opposed to the nine Data Pages that would be used for the Page Stripe 300 of FIG. 3A.

Figure 3C:
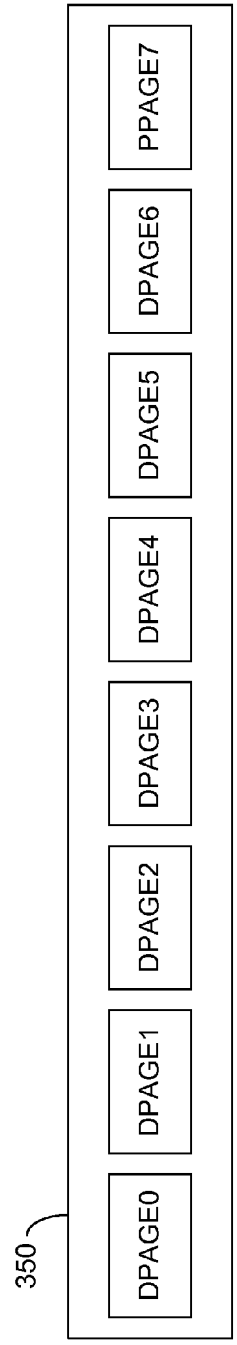

FIG. 3C illustrates yet another Page Stripe 350, in accordance with the teachings of the present disclosure. Page Stripe 350 includes only eight total pages, with seven of the Pages (DPAGE0-DPAGE6) being Data Pages and one of the Pages (PPAGE7) being a Data Protection Page.

Figure 3D:
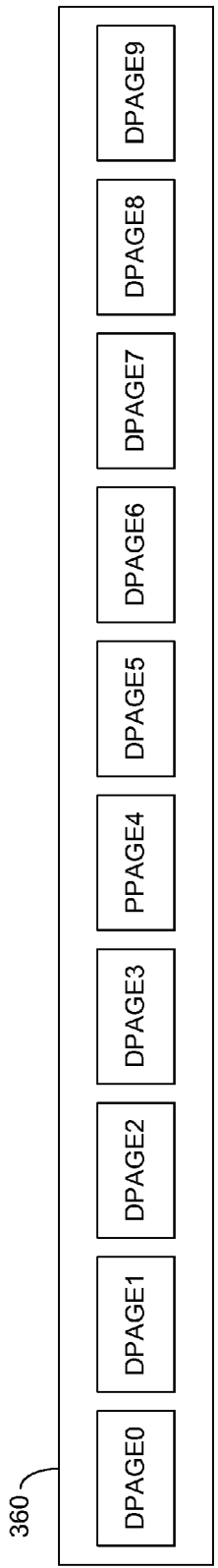
Figure 3E:
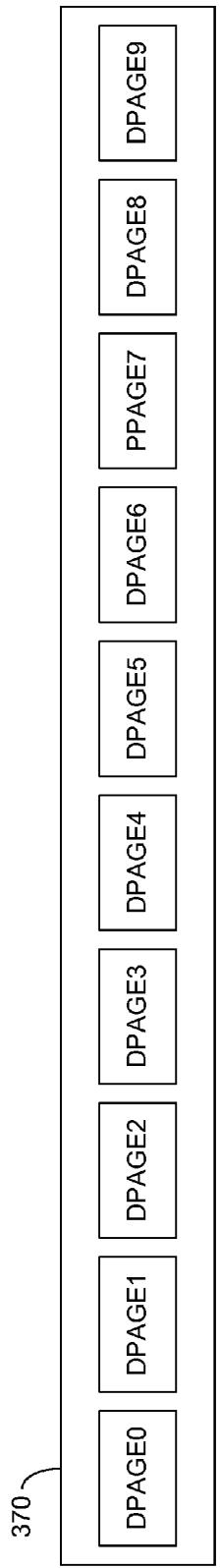
Figure 3F:
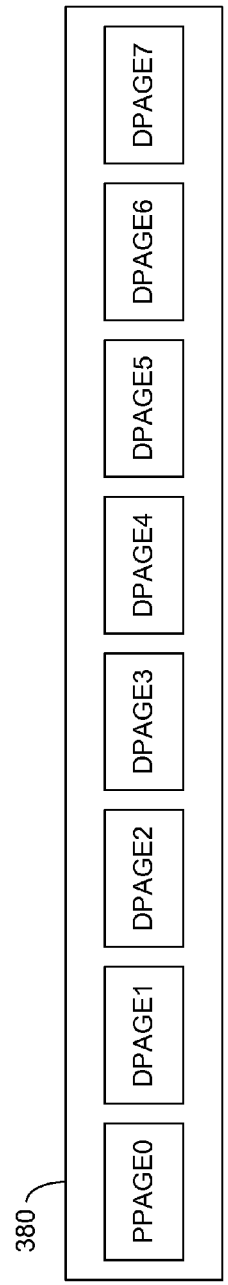

In the exemplary system 100 disclosed herein, it is not necessarily required to have the Data Protection Page be located as the last page of a given Page Stripe. The Data Protection Page can be located at any of the Page locations within the Page Stripe. As one example of such a Page Stripe, FIG. 3D illustrates a Page Stripe 360 that is formed from a total of ten Pages of information, where the Data Protection Page is located at the PPAGE4 location. As an alternate example, FIG. 3E illustrates a Page Stripe 370 with ten Pages of information including nine Data Pages and a Data Protection Page at the PPAGE7 location. FIG. 3F illustrates yet another example, depicting a Page Stripe 380 having eight Pages, including seven Data Pages and one Data Protection Page at the PPAGE0 location.

Page Stripes: Storage Format

While the memory locations in which the Pages of data within a Page Stripe can be stored may vary within memory array 14, in one embodiment, the Pages that make up a given Page Stripe are stored in physical memory locations selected in such a manner that the overall operation of the memory system 100 is optimized. In this embodiment, the physical memory locations in which the data in each Page Stripe is stored are such that the physical Lane associated with each Page of data within the Page Stripe is different from the Lanes associated with the other Pages that make up the Page Stripe. As generally reflected in FIG. 7A, this embodiment allows for efficient writing and reading of a Page Stripe to the memory array since it allows all of the Pages of data that make up the Page Stripe to be written to the memory array 14 simultaneously or near-simultaneously by having the FLASH controller 10 issue commands to the various Lanes at, or close to, the same time.

Figure 7A:
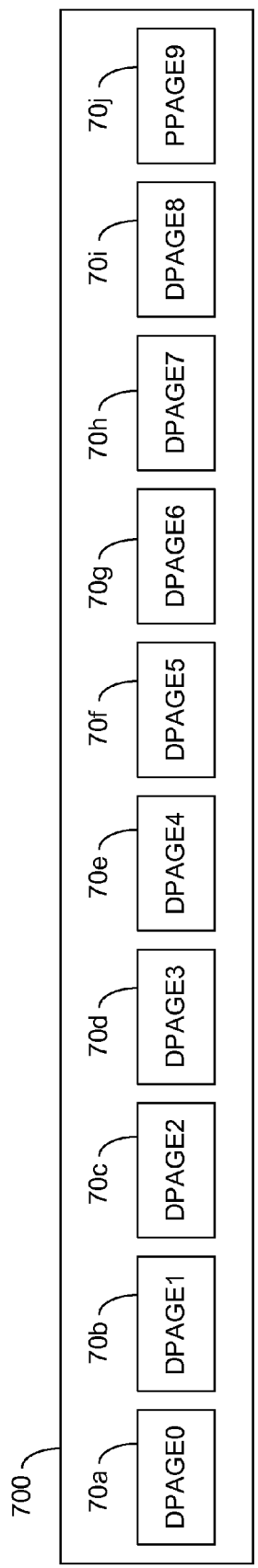
FIGS. 7A and 7B illustrate an exemplary Page Stripe and an exemplary storage arrangement for the Page Stripe in accordance with the present disclosure.
Figure 7B:
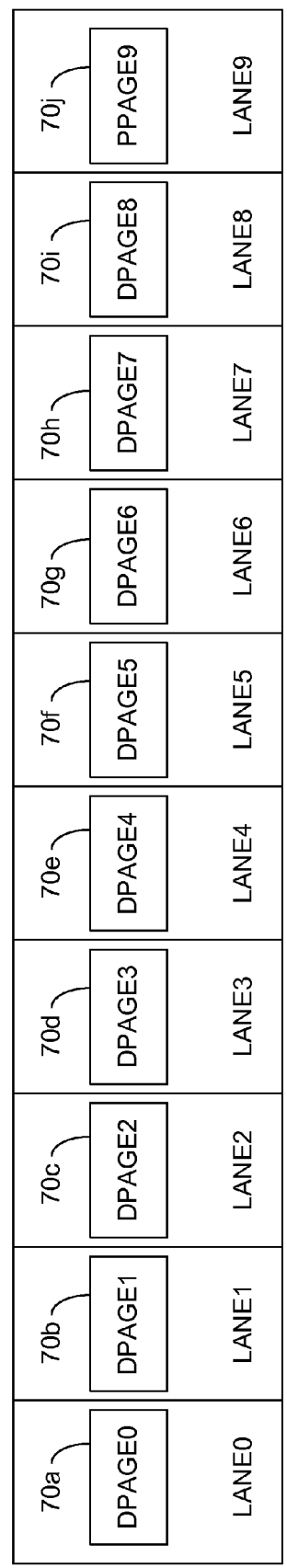

FIG. 7A illustrates an exemplary Page Stripe 700 consisting of nine Data Pages 70a, 70b, 70c through 70i and one Data Protection Page 70j. FIG. 7B illustrates the manner in which this Page Stripe 700 can be stored in the memory array 14 of FIG. 1.

In the example of FIG. 7B, the first Data Page 70a is stored in a physical memory location within LANE0; the second Data Page 70b is stored in a physical memory location within LANE1; the third Data Page 70c is stored in a physical memory location within LANE2, and so on until the ninth Data Page 70i is stored in a physical memory location within LANE8. The Data Protection Page 70j is stored in a physical location within LANE9.

Because the various Pages that make up the exemplary Page Stripe 700 are stored as illustrated in FIG. 7B, and because there are independent communication lines between the FLASH controller 10 and each of the various Lanes, all of the Pages associated with Page Stripe 700 can be written to or read from the memory array 14 simultaneously or near-simultaneously. This arrangement allows for relatively quick read and write operations and allows data to be stored to and retrieved from the memory array 14 in an efficient and effective manner.

It should be noted that the example of FIGS. 7A and 7B is but one example of how a Page Stripe can be stored within the physical memory array. FIGS. 8A and 8B illustrate an alternate arrangement.

FIG. 8A illustrates an exemplary Page Stripe 800 that includes eight Data Pages 80a-80h and a single Data Protection Page 80i. FIG. 8B illustrates an example of how the Pages making up Page Stripe 800 can be stored in the memory array 14. In the illustrated example, the first Data Page 80a is stored in a physical location associated with LANE0, the second Data Page 80b within a physical location associated with LANE1 and the third Data Page 80c in a physical location within LANE2. Note however, that there is no Data Page stored within any physical location associated with LANE3. The fourth through eighth Data Pages (80d-80h) are then stored in physical locations within LANE4-LANE8, respectively, and the Data Protection Page 80i is stored within a location in LANE9. This example illustrates the fact that in the illustrated embodiment, while each Page of data within a Page Stripe is stored in a location associated with a Lane that differs from the Lane associated with the storage locations of each other Page within the Page Stripe, it is not necessary that data for a Page Stripe be stored in locations within each Lane. For Page Stripes that include a number of Pages that is less than the number of Lanes of a given memory array, there will be one or more Lanes in which no data within the Page Stripe are stored.

In each of the examples of FIGS. 7A-7B and 8A-8B, the Pages that make up the exemplary Page Stripes are stored sequentially across the Lanes, such that each of the Lane designations for the memory locations associated with the Pages within the Page Stripe are sequential as one considers the Page Stripe from the first Data Page to the Second Data Page continuing to the Data Protection Page. While this approach is not critical to the disclosed embodiments, it is beneficial in that it can simplify the implementation of the disclosed subject matter.

While there may be benefits to having the Pages associated with a given Page Stripe stored sequentially across the available Lanes, it is not critical that the Pages within a Page Stripe be written in any particular order. In some embodiments, Page Stripes are stored such that the Pages associated with the Page Stripe are written sequentially across the Lanes, but with the first Data Page of the Page Stripe written into a physical location associated with a Lane other than LANE0. These embodiments are illustrated in FIGS. 9A-9D below.

Figure 9A:
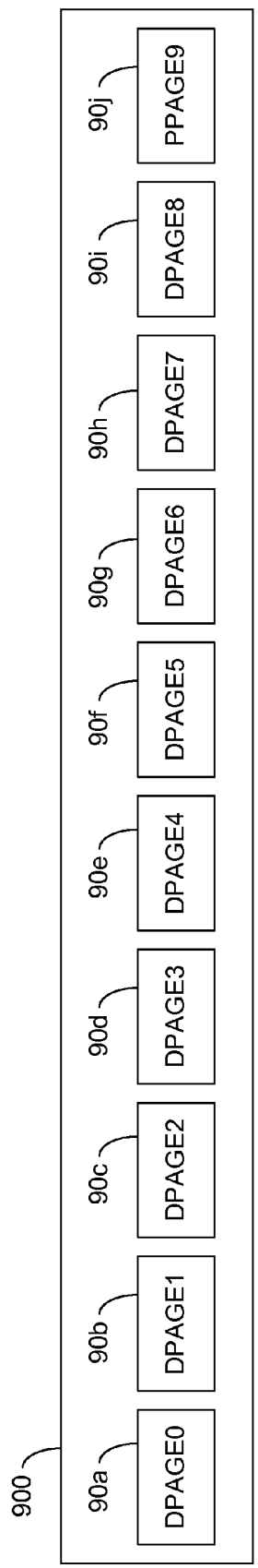
Figure 9B:
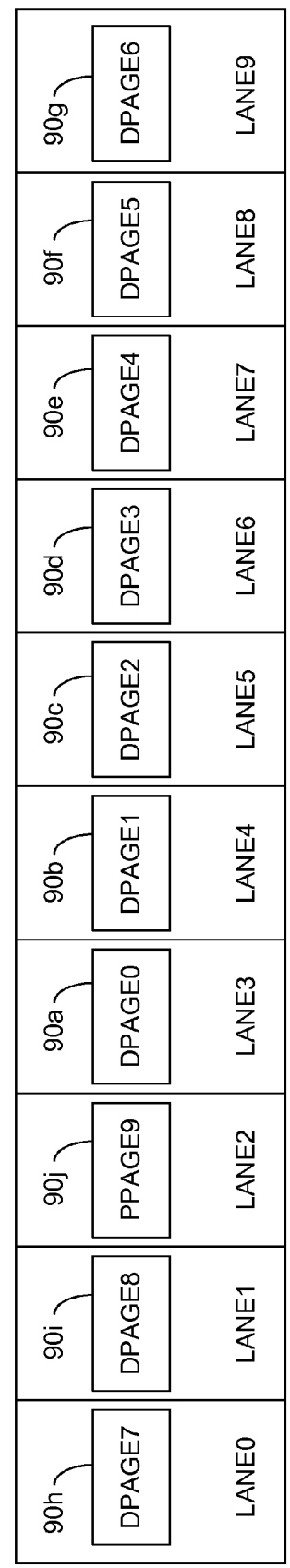
Figure 10A:
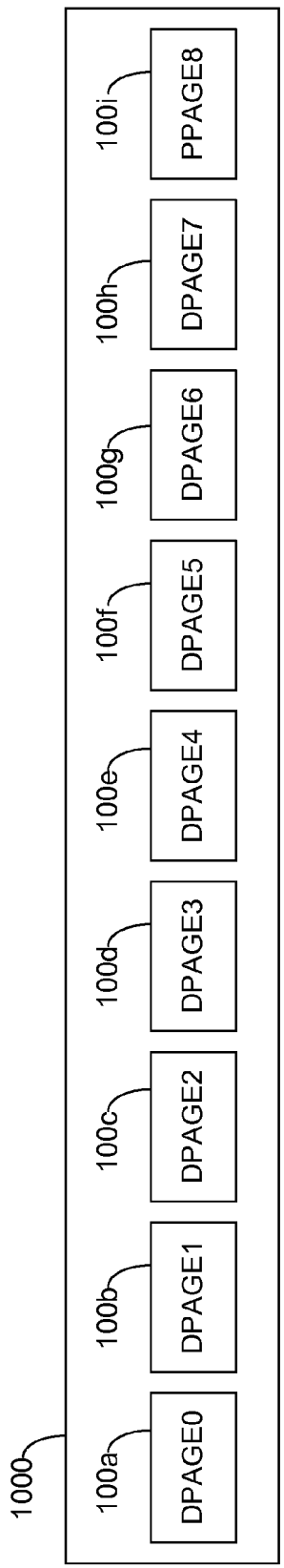
Figure 10B:
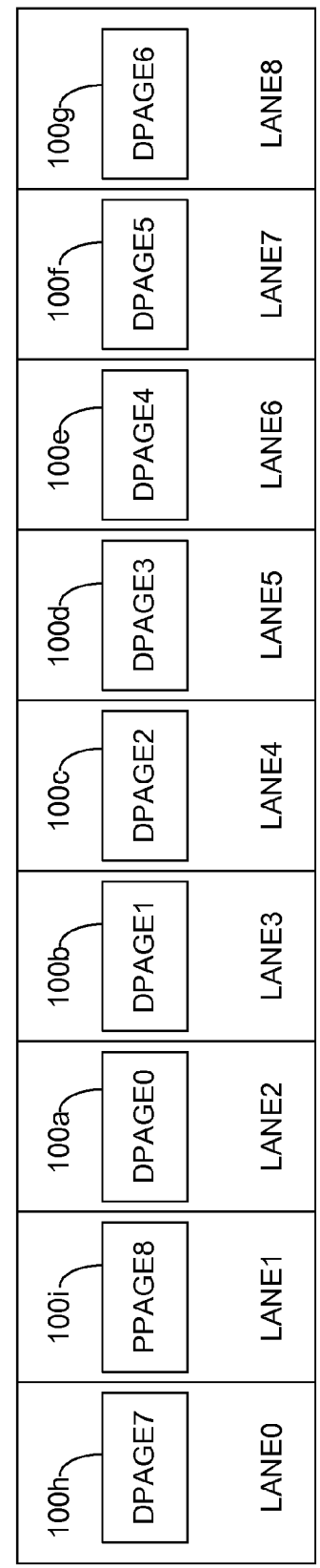

FIGS. 9A-9D illustrate examples of how an exemplary Page Stripe 900 containing nine Data Pages 90a-90i and a single Data Protection Page 90j can be written sequentially across Lanes within memory array 14 with the first Data Page being stored in a location associated with a Lane other than LANE0. For example, in FIG. 9B, Page Stripe 900 is stored sequentially with the first Data Page stored at an address associated with LANE3 and the Page Stripe sequentially "wrapping around" such that the Data Protection Page 90j is stored in an address associated with LANE2. FIG. 9C illustrates storage with the first Data Page 90a in an address associated with LANE4 and FIG. 9D illustrates storage with the first Data Page 90a in an address associated with LANE5.

FIGS. 10A-10D illustrate still further examples of how a Page Stripe 1000 including eight Data Pages and a single Data Protection Page can be written into memory array 14. In general, Pages within a particular Page Stripe may be written to various Lanes, in any order, so long as no two Pages of the same Page Stripe occupy the same lane.

Memory System 100—Exemplary Operations

Having described the general physical structure of the memory system 100 and aspects of the manner in which data in the form of Page Stripes is addressed and stored within the memory array 14, certain operational aspects of the system 100 will be described including aspects relating to the WRITING and READING of data to and from the system.

Exemplary WRITE Operations

At a high level, and in general, the exemplary system of FIG. 1 may perform WRITE operations through a number of steps including:

(1) receiving from a host device data, typically in the form of a Page of data, to be stored in memory along with a Logical Block Address (LBA) at which the host device would like for the data to be stored;

(2) determining whether the LBA for the received data was previously associated with one or more different physical memory Pages and, if so, changing the status of the previous Page of memory to indicate that the previously stored data is no longer valid; and (3) identifying an available Page within a Page Stripe where the received data can be stored;

(4) configuring the received data such that it is divided into a data group that fits within the identified Page Stripe on a Page-aligned basis (i.e., data that can be written into a Page or a Page Stripe on a Page-by-Page basis);

(5) writing the data into the available Page;

(6) updating a table associating Logical Addresses from the host device with physical addresses in the memory array to associate the physical Page where the data was stored with the LBA provided by the host device.

It is not critical that these operations be performed in the described order.

The step of receiving, from a host device, data to be stored and an LBA where the host device would like for the data to be stored is relatively straightforward. For the embodiment of FIG. 1, the data and the LBA supplied by the host are typically provided to the System Controller 10 over the communication bus 12.

The step of determining whether the LBA for the received data was previously associated with one or more different physical memory Pages and, if so, changing the status of the previous Page of memory to an indication that the data is no longer valid (a DIRTY indication) involves the FLASH controller 10 comparing the received LBA to the LBA entries in the Logical-to-Physical conversion tables. If the comparison indicates that the LBA provided by the host device for the current WRITE operation was previously associated with another physical memory location, then the system will know that the previously stored data is no longer valid. Accordingly, the system will change a status indicator for the physical Pages of data associated with the previously stored data to indicate that they are DIRTY, or no longer valid.

The step of identifying one or more available Pages where the received data can be stored can be implemented in a variety of ways. In many instances, the FLASH controller will already be in possession of information that identifies a specific group of associated Blocks in physical memory that are available to store data. In such instances, the FLASH controller 10 will then have an internal count indicating which Pages within the group of Blocks already have data stored therein and will use the next available group of Pages as a source for a Page within a Page Stripe for the data to be stored. This process is illustrated generally in FIG. 11.

Figure 11:
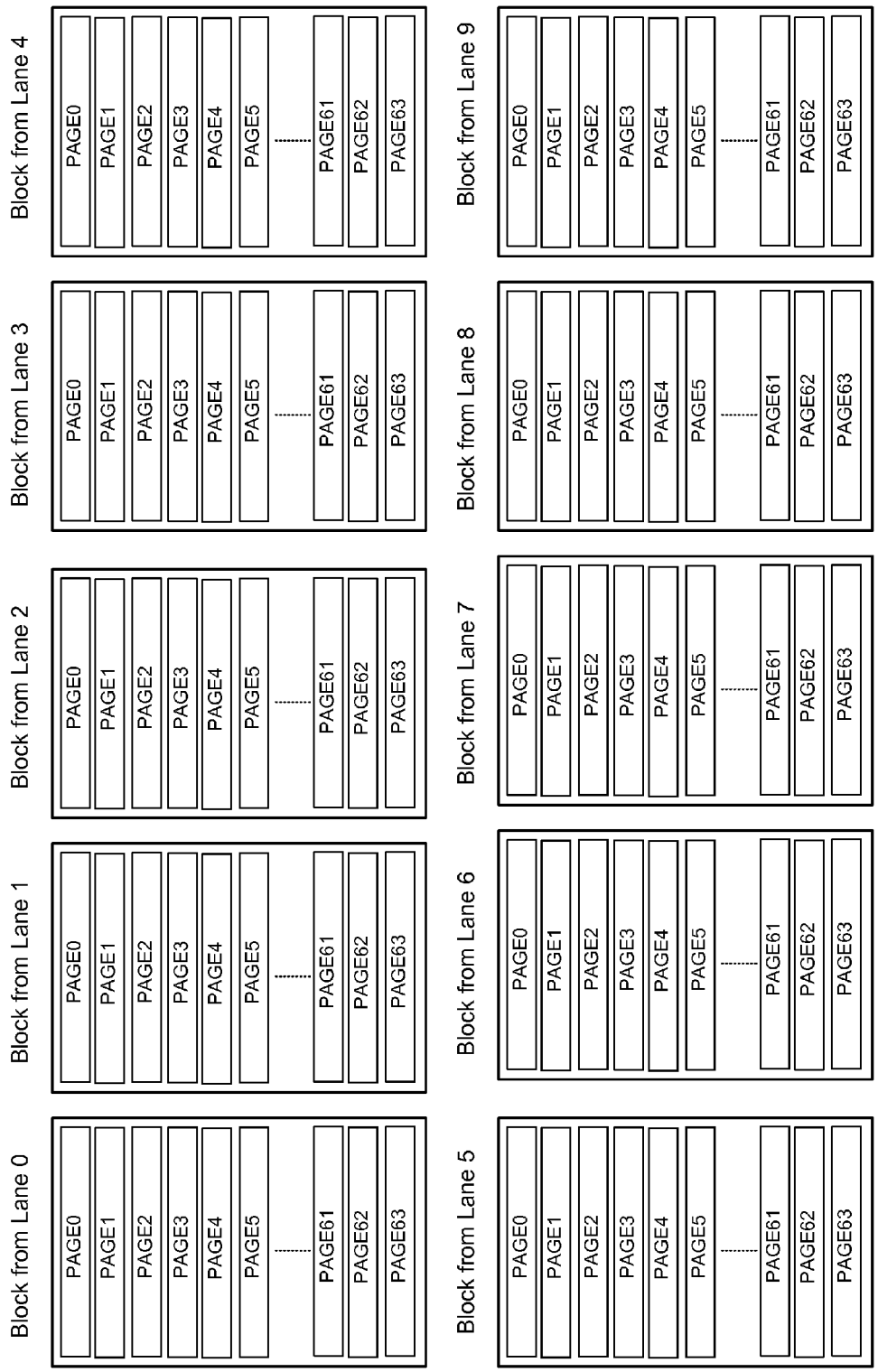
FIG. 11 illustrates an exemplary arrangement of Data Pages within groups of Blocks in accordance with the present disclosure.

FIG. 11 generally illustrates the selection of a Page Stripe location in instances where the FLASH controller 10 is already in possession of information identifying a group of blocks in physical memory where data may be stored. Because the group of Blocks is intended for the storage of Page Stripes, and because there is a general one-to-one correspondence between the number of Blocks in the group of Blocks and the number of Pages in the Page Stripes that are stored in the Blocks, the group of Blocks is referred to herein as a Block Stripe. In the example of FIG. 11, the Block Stripe is sized to have ten Blocks such that the Page Stripes stored within the Block Stripe have nine Data Pages and one Data Protection Page.

Figure 12:
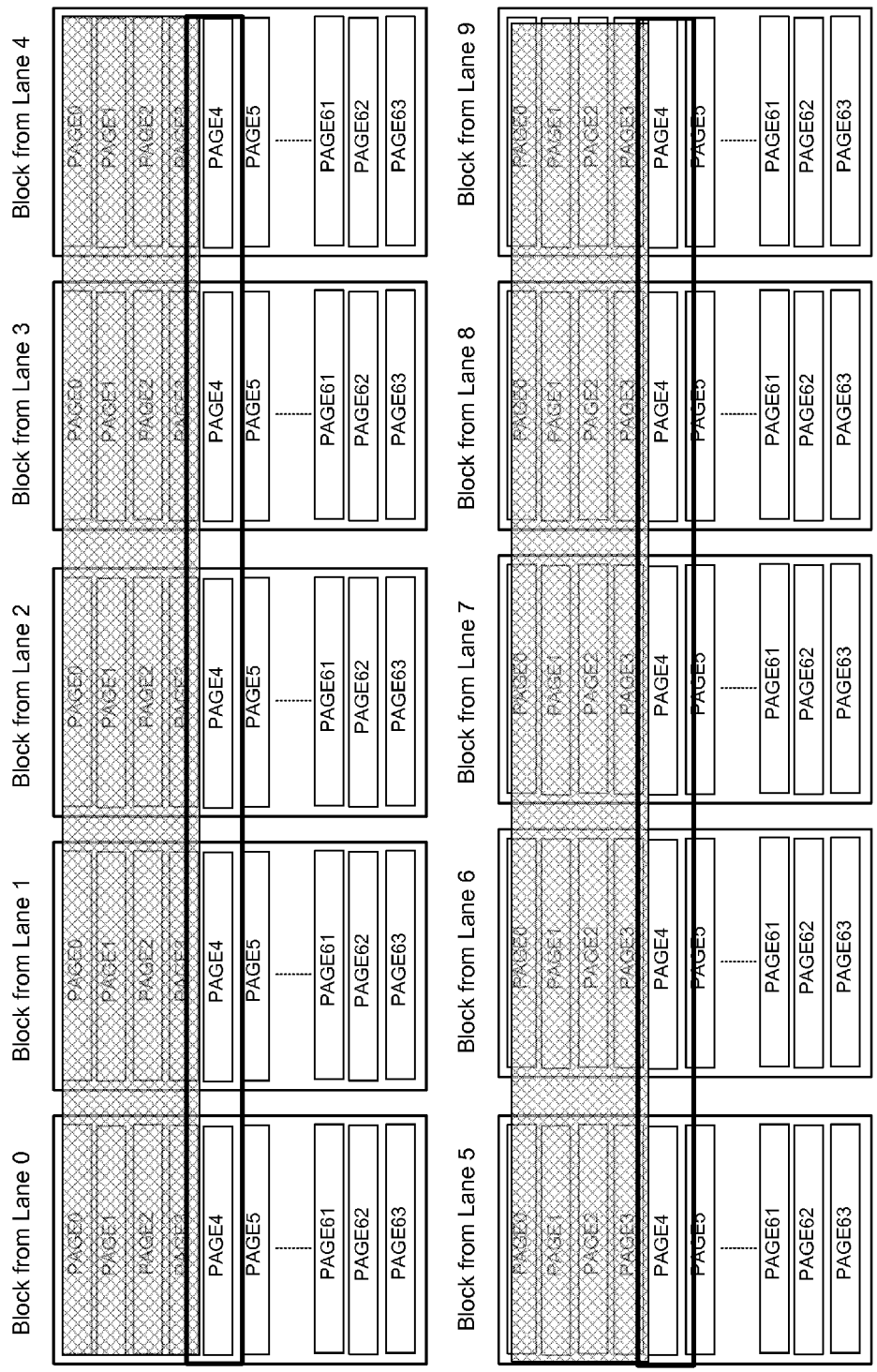
FIG. 12 illustrates an exemplary arrangement of Data Pages within groups of Blocks where data pages that already contain data are indicated as unavailable in accordance with the present disclosure.

In FLASH memory, it is beneficial to write data into a Block sequentially, by Page. Thus, when writing to a Block of FLASH memory, it is desirable and beneficial to write first to the PAGE0 location, then to the PAGE1 location and so on until the Block is full, or nearly full, of stored data. In the embodiment of FIG. 11, this form of writing is accomplished by having the FLASH controller 10 maintain a count so that the first Page Stripe written into a given Block Stripe is written across all of the PAGE0 locations of the Blocks within the Block Stripe, the next Page Stripe across the next page, PAGE1 locations within the Block Stripe and so on. This is reflected in the illustrated example of FIG. 12 where it is assumed that the FLASH controller 10, at the time it received the WRITE operation from the host device, had information indicating that the Block Stripe had locations available for storage of a Page Stripe. For purposes of explanation, it is also assumed that Page Stripes had already been stored in the PAGE0-PAGE3 locations within the Block Stripe as reflected in FIG. 12. Thus, in this example, the FLASH controller would identify the Page Stripe for the PAGE4 locations within the Block Stripe as the physical location to which the received data should be stored.

In the previous example, it was assumed that the FLASH controller 10 was already aware of a Block Stripe in which data could be stored. Under certain conditions, the FLASH controller 10 will not be aware of a Block Stripe in which data can be stored. This condition can occur, for example, just after the FLASH controller has written a Page Stripe to the last available page locations of a previously available Block Stripe. Under these conditions, the FLASH controller needs a mechanism for identifying another available Block Stripe to store data.

In one embodiment of the memory system 100 described herein, the mechanism for identifying available Block Stripes involves having the FLASH controller 10 pull data identifying an available (or free) Block Stripe from a buffer in which locations of Free Block Stripes are stored. This buffer, referred to herein as the Free Block Stripe Buffer, is a buffer that contains, for each entry, information that identifies a group of Blocks into which data can be stored in a Page Stripe manner. In this embodiment, the entries in the Free Block Stripe Buffer are such that all of the Blocks corresponding to an entry have been previously erased and are, therefore, available for the immediate storage of data.

In embodiments where the memory system 100 can store Page Stripes of different format, the Free Block Stripe Buffer may also contain specific information for each entry, or for a group of entries, indicating the format of the Page Stripes that can be stored in the buffer. For example, such entries may indicate that the Block Stripe corresponding to one particular entry of the Free Block Stripes buffer can store Page Stripes having nine Data Pages and one Data Protection Page and that the Block Stripe for a different entry can store Page Stripes having eight Data Pages and one Data Protection Page. This formatting information can be stored as part of the Free Block Stripe Buffer or could be stored in a different buffer. Alternatively, multiple Free Block Stripe Buffers could be maintained with each one storing Block Stripes capable of storing Page Stripes of different formats. In that embodiment, there would be one Free Block Stripe buffer that stored Free Block Stripes capable of storing Page Stripes having nine Data Pages and one Data Protection Page, another Free Block Stripe Buffer storing Free Block Stripes capable of storing Page Stripes having eight Data Pages and one Data Protection Page and, potentially other Free Block Stripe Buffers storing Free Block Stripes capable of storing Page Stripes having seven (or even fewer) Data Pages and one Data Protection Page.

In embodiments where there are one or more Free Block Stripe Buffers, each corresponding to Page Stripes of different formats, the FLASH controller 10 can intelligently decide to select the entry in the Free Block Stripe Buffer that would optimize overall performance of the memory system 100. For example, if the FLASH controller 10 was aware that the host device was attempting multiple WRITE operations to the system and each WRITE operation was associated with data sufficient to store nine Data Pages of data, or if the controller 10 was attempting to move only nine pages of data, the FLASH controller could select the Free Block Stripe Buffer entry corresponding to a Block Stripe of adequate size to store a Page Stripe with nine Data Pages (and one Data Protection Page). If the FLASH controller 10 was aware that the host device was attempting multiple WRITE operations and all, or a substantial number of the operations involved quantities of data insufficient to fill nine Data Pages of data, or if the controller was attempting to move less than nine pages of data, the FLASH controller could select an entry from the Free Block Stripe Buffer corresponding to a different Page Stripe format (such as a Page Stripe with eight Data Pages and one Data Protection Page). (Move operations are discussed in more detail below.) In this manner, the overall operation of the system could be optimized.

Still further, in some embodiments of the memory system 100 of FIG. 1, the FLASH controller 10 could select and have available for storage multiple Block Stripes. Thus, as long as the received WRITE operations from the host device, or data for a move operation, was such that there was sufficient data to fill nine Data Pages, the FLASH controller could select Block Stripes sufficient to store Page Stripes with that number of data pages. If a WRITE or move operation was such that it did not have adequate data to fill nine Data Pages, or if the data when configured has a portion that could not fill nine Data Pages, the FLASH controller 10—to the extent that it did not otherwise have an available Block Stripe of that format— could select a Free Block Stripe from the Free Block Stripe Buffers that was of a size appropriate to the amount of data to be stored. This approach could improve the overall performance of the system because, in the absence of such a step, it may be necessary to add dummy data (in the form of appended logical 0s or 1s) to received data to "fill" out a Page Stripe.

Various approaches and methods for populating the Free Block Stripe Buffer(s) are discussed in more detail below.

After an available Page Stripe location is selected, the FLASH controller 10 will, in some embodiments, configure the data received during the WRITE operation so that it will "fit" into the selected Page Stripe location on a Page-aligned basis. This step will involve the Flash Controller 10 breaking up the received data into data groups appropriate for storage in a Page Stripe, generating the data to be stored in each Data Page of the Page Stripe (including any LBA data, CRC and/or ECC data as discussed above) and also generating the data for the Data Protection Page for the Page Stripe (as discussed above). Under circumstances where the amount of data from the host device that is to be stored in the Page Stripe is insufficient to fill out all of the Data Pages for the Page Stripe, the FLASH controller 10 may append logical 1's or 0's (or any other data) to the data to be stored so that a complete Page Stripe of information can be written to the physical Page Stripe location.

While this configuration step is described above as following the step of selecting the Page Stripe location for the storage of the data, the order of steps could be reversed. In such embodiments, the configuration step could be used to identify the amount of data that was to be stored in the Page Stripe which could enable the FLASH controller 10 to select the available Page Stripe location that would minimize or eliminate the need to append data bits to the stored data to fill out the Data Pages for the Page Stripe. Since such appended data bits do not constitute actual host device stored data, the reduction of the extent of the appended bits can enhance overall system performance.

After the data to be stored is configured as described above, the configured Page Stripe is written to physical memory. This step involves the FLASH controller 10 issuing the appropriate commands across the communication bus 16 to indicate to the memory storage devices that write operations will occur, to indicate the specific Page locations where the write operations will occur and to provide the data for those operations. As noted above, because of the design of the memory system 100, the write operation may occur simultaneously or near-simultaneously for all of the Pages that make up the Page Stripe being stored.

At, after, or prior to the time of the actual writing of the Page Stripe data to physical memory, the FLASH controller 10 will update the Logical-to-Physical conversion table to associate the LBA provided by the host device with the actual physical locations where the data provided by the host device for storage at that LBA was stored.

Still other embodiments are envisioned where the FLASH controller 10 will write data to the memory array 14 on a Page-by-Page basis as data is received from a host device. Thus, as a given Page of data is received and a WRITE request is received, the FLASH controller will write the data to the next Page in the current Page Stripe. In this embodiment, because data is written as received on a Page-by-Page basis, there is the potential that a READ operation could be requested of a Page before the Page Stripe containing that Page is "filled-out" and before the Data Protection Page for the Page Stripe containing the Page is stored to physical memory.

If, a READ operation is requested with respect to a Page written in such a manner, the FLASH controller can retrieve the data for the requested Page and, assuming that the ECC and CRC data confirms that the Page has valid data and/or identifies an error that can be corrected through use of the ECC data within the Page, provide the requested Page of data to the host device. In such a circumstance, there is no need for early completion of the Page Stripe containing the page and the memory system 100 can merely await the receipt of adequate information to complete the Page Stripe.

In the embodiment described above, however, there is a potential that the requested Page will have an error associated with it that cannot be regenerated from the ECC and CRC data. In such an embodiment, it will be necessary to utilize the Data Protection Information for the incomplete Page Stripe as it would be stored in the addressable XOR memory buffer associated with that Page Stripe. In such an embodiment, the FLASH controller 10 could: (i) take the accumulated XOR data for the "incomplete" Page Stripe; (ii) modify the format for the Page Stripe at issue so that the modified format includes only the received data as of that time (e.g. if only seven Data Pages had been received, the modified Page Stripe format would have seven Data Pages and one Data Protection Page); and (iii) write the then-accumulated XOR data to the Data Protection Page for the reformatted Page Stripe. The system could then use the then-completed, modified Page Stripe to recreate the data for the Page that was corrupted. The next WRITE operation received by the system would then be to a different Page Stripe. This approach would, therefore, allow the system to modify and "complete" a Page Stripe and use the Data Protection Page information for that Page Stripe to regenerate data from a lost or corrupted page without having to either: (a) wait until a Page Stripe of nine Data Pages and one Data Protection Page is completed or (b) complete a ten-Page Page Stripe through the writing of dummy data (e.g., all 0's, 1's, or other dummy data).

Populating the Free Block Stripe Buffer(s)

As noted above, depending on the embodiment, one step of the WRITE operation can involve the FLASH controller 10 pulling Free Block Stripe information from one or more Free Block Stripe Buffers. The following discusses the manner in which the Free Block Stripe Buffer (or Buffers) can be populated. In one embodiment, the Free Block Stripe Buffer(s) is/are populated through the use of apparatus and methods that:

(i) monitor the memory array to identify Blocks that are in a condition to be erased;
(ii) placing the identified Blocks in one or more buffers that store information concerning Blocks that are ready to be erased;
(iii) monitoring the ready to erase buffers to identify Blocks that, according to certain conditions, may be associated with one another to form a Block Stripe;
(iv) upon identifying Blocks that may be associated to form a Block Stripe in accordance with the applied conditions:
  (a) moving VALID data as may be necessary from the identified Blocks to other physical storage locations;
  (b) performing ERASE operations on the identified Blocks once cleared of VALID data;
  (c) associating the identified Blocks with one another to form a Block Stripe that is free and available for data storage; and
  (d) placing information identifying Free Block Stripes in one or more of the Free Block Stripe Buffers (which are described above).

To understand the following discussion it is helpful to have an understanding of certain aspects of a FLASH memory device. In general, a particular Page within a FLASH memory device must be completely erased before any data can be written to that Page. As discussed above, the ERASE operation typically involves the setting of all of the bits in a particular Block of data to a logical 1 state or a logical 0 state. After a Block of FLASH memory has been erased, data can be written into the Pages within that Block. As discussed above, it is beneficial to perform such write operations on a sequential, Page-by-Page basis, such that data is first written to the PAGE0 location, then to the PAGE1 location and continuing down the pages of the Block. Because of this aspect of FLASH memory, whenever a host device attempts multiple WRITES to the same logical address, or LBA, it is not possible or optimal to write the data associated with that request to the same physical memory locations. This is because writing to the same physical Page would first require a lengthy erasure of the block in which the Page resides. Thus, in certain embodiments of the systems disclosed herein, sequential WRITE operations directed by the host device to the same LBA will commonly and typically involve write operations to different physical locations. When this occurs, the data that was previously stored in the physical location formerly associated with the LBA is no longer valid data. It is, as described herein, DIRTY data, in that it no longer is guaranteed to correspond to the actual valid data associated with the LBA at issue.

Identification of Blocks that are Ready to be Erased

Because ERASE operations in FLASH memory devices are performed on a Block-by-Block basis, and because the fact that one Page of data in a Block is DIRTY does not indicate that any of the other Pages within the Block are DIRTY, it is not optimal to ERASE a Block because one (or even several) Pages of data become dirty. However, it has been discovered that it is also not optimal for the memory system 100 to wait until conditions exist where all of the Pages within a given Block become DIRTY. This is because such conditions may not occur or, if they do occur, they occur at intervals that are not optimal for system performance. Thus, in certain embodiments of the memory system 100 disclosed herein, apparatus and methods are used to monitor the memory array to identify Blocks that are in a condition to be erased. This identification is done in a manner that optimizes overall system performance.

In this embodiment, the system maintains one or more tables that track the "DIRTY" status of various pages within the system. In one embodiment, one or more tables are maintained that track, for each Block Stripe, the number of DIRTY pages within the Block Stripe. In that embodiment, a Block Stripe State Table can be maintained, where each entry in the table corresponds to a given Block Stripe. Whenever the table indicates that a Block Stripe is sufficiently dirty, the remaining valid data in the Block Stripe could be written into alternate physical memory locations through a move operation and the LPT table updated to reflect the move.

In some embodiments, a previously erased Block Stripe will be directly placed in the Free Block Stripe Buffer. However, in situations where one or more of the Blocks within the Block Stripe are determined to be bad or where a FLASH chip or portion of a chip containing the Block Stripe is determined to be bad, the Block Stripe that was erased cannot be used. In such situations new Block Stripes can be assembled from the Blocks of such Block Stripes using one or more Ready-to-Erase Buffers that contain information about Blocks within such Block Stripes.

Assembly of Free Block Stripes Using the Ready to Erase Buffer(s)

In the exemplary memory system 100 of FIG. 1, a beneficial approach involving the use of one or more Ready-to-Erase (or "RTE") Buffers is utilized. In this approach, the memory system 100 maintains one or more of a number of related Ready-to-Erase buffers in which information identifying one or more Blocks of physical memory that are ready to be erased are maintained and in which the system follows a process of using the data in the Ready-to-Erase buffer to select blocks of data for efficient Erasing operations.

Figure 13:
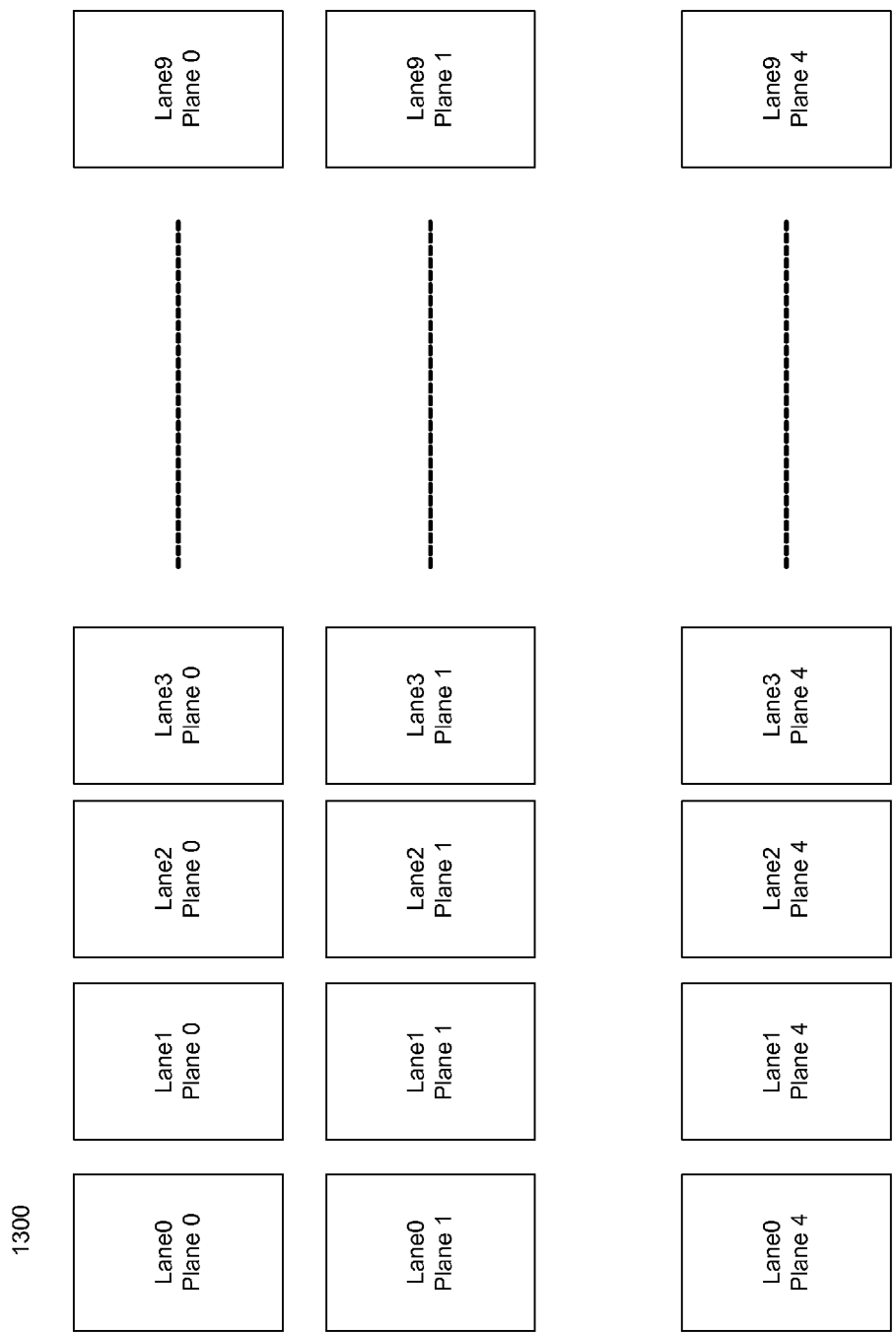
FIG. 13 illustrates an exemplary Ready-to-Erase buffer in accordance with the present disclosure.

FIG. 13 illustrates one exemplary set of RTE buffers 1300 that may be utilized with the memory system 100 of FIG. 1. The illustrated set of buffers is for a given Chip Enable. The RTE buffers within the set 1300 can be maintained as individual buffers, a large arrayed buffer, or a collection of arrayed buffers. The arrangement is not critical as long as the Blocks within the RTE buffer set 1300 can be associated with one another on a per Lane and per Plane basis. The buffers within set 1300 may be maintained by CPU 15 and stored within a memory location utilized by CPU 15. The buffers within the set 1300 may be first-in first-out (or FIFO) buffers.

As noted above, in the example of FIG. 13, the RTE buffers are maintained on a per Lane and per Plane basis such that the set 1300 of RTE buffers identifies, at any given time, Blocks of memory that are ready to be erased and, for each such Block, the specific Lane and Plane associated with that Block. Because of this organization, the memory system 100 can use the RTE buffers to efficiently perform ERASE operations to optimize the overall performance of the system 100.

In one embodiment, the CPU 15 within the memory system 100 monitors the information in the RTE buffer set 1300 to identify groups of Blocks within the RTE buffer that are associated with memory locations that can be used to efficiently store a Page Stripe of data. When such a group of Blocks is identified, the CPU 15 will execute instructions to: (1) cause an ERASE operation to be performed on the Blocks within the identified group, and (2) cause one or more indications to be provided that: (a) associate the Blocks in the identified group with one another so that memory locations within the Blocks can be used to store Page Stripes of data, and (b) indicate that the Blocks that make up the identified group are free and available to store data.

Various approaches can be implemented using CPU 15 to identify Blocks within the RTE buffer set 1300 that are optimal for use in storing a Page Stripe of data.

For various reasons, it can be beneficial to store the Pages within a Page Stripe of data in memory locations that: (a) are associated with different Lanes and (b) are all within the corresponding Planes.

Exemplary benefits of having the Pages of a Page Stripe correspond to different Lanes were discussed above.

One of the benefits of having all of the Pages of a Page Stripe within the same Plane is that it allows for the use of faster and potentially more efficient operations to move data within the physical memory array. The act of moving data from one physical Page location to another Page location can be accomplished in a variety of ways. One approach for such a movement of data would be to read the data from the original Page into a buffer external to the FLASH chip where the data originally resided and then WRITE the data into a Page within the same or a different FLASH chip. While such an approach accomplishes the ultimate objective of moving the data from the original Page location to a new Page location, the approach requires the time and overhead associated with providing the data external to the FLASH chip and writing the data from an external location into a location within the same or a different FLASH chip. Another approach allowed by many FLASH memory chips is to take advantage of the fact (generally described above) that the Pages within a given Plane of a FLASH chip typically share input/output circuitry that includes an Input/Output (I/O) Buffer. Because of this sharing of I/O circuitry, it is possible to move data from one Page within a particular Plane into another Page within the particular Plane without having to incur the overhead expenses (in terms of time, power, etc.) involved with reading the data to be moved to a location external to the chip and then back into the same or a different chip. Many FLASH devices provide support for such intra-Plane moves. By ensuring that all of the Pages within a given Page Stripe are in the same Plane, the disclosed system enhances the ability of the system to ensure that most or all of the movements of the data within a Page Stripe (e.g., a move required by a subsequent WRITE to a Page location within a Page Stripe containing data) are intra-Plane moves that can utilize the faster and more efficient approach(es) that can be used to implement intra-Plane data transfers. This is because it would be difficult for the system to identify destination locations that would allow for each Page of the Page Stripe to be moved via an intra-Plane operation if the Pages within the Page Stripe were from different Planes.

In accordance with the teachings of the present disclosure, one approach for identifying a suitable group of Blocks within the RTE buffer set 1300 to obtain the advantages described above would be to monitor the Blocks in the buffer set 1300 to determine when groups of Blocks can be identified where: all of the Blocks within the candidate group are associated with physical addresses in different Lanes and where all of the Blocks within the candidate group are associated with the corresponding Planes. Under this approach, the system CPU 15 would execute instructions that associate all of the Blocks within the candidate group with one another and that cause an ERASE operation to be performed on all of the Blocks within the candidate group.

The precise approach used to determine when sufficient Blocks of data have been identified that meet the above criteria (e.g., different Lanes, corresponding Planes) can vary depending on the operational status of the memory system 100. For example, when the RTE buffers are populated such that the overall set of candidate blocks is uniformly distributed across Lanes and Planes, then the CPU may simply wait until there is one block in each Lane, with each block residing in the same corresponding Plane. This approach would allow the Page Stripe that could be formed from the group of Blocks to have the maximum number of Pages (assuming that each Page of data was to be stored in an address with a different Lane association). Because this approach would maximize the amount of data stored in each Page Stripe, it may be the initially preferred approach and, the system 100 may first look for groups of Blocks within the RTE buffer set 1300 such that: (i) each Block is associated with a different Lane; (ii) each Block is associated with the same corresponding Plane; and (iii) the number of Blocks is equal to the number of Lanes.

Under certain operating conditions, the population of the Blocks in the RTE buffer set 1300 may be such that it is difficult or impossible for the system to readily identify a candidate group of Blocks meeting the preferred criteria described above. This condition could exist, for example, when one or more of the FLASH memory chips that make up the memory array 14 fail. While failures are not common and not expected, they can occur. Thus, it is possible that, for a given memory array 14, one or both of the FLASH memory chips associated with a given Lane could fail. In embodiments, where only known-good Blocks are placed in the RTE buffer set 1300 and where both FLASH chips associated with a given Lane fail, the failure of the FLASH chips would ensure that no Blocks associated with that Lane are placed in the RTE buffer. The absence of Blocks associated with the Lane associated with the failed FLASH chips would ensure that the preferred conditions (where there is a Block associated with each Lane) would not occur.

In addition to complete chip failures, partial chip failures could create conditions under which it would be difficult to identify candidate groups within the RTE Buffer set 1300 that meet the preferred conditions. For example, while complete FLASH chip failure is relatively rare, it is not uncommon for given Blocks within a chip, given Planes within a chip, or given CEs within a chip either to fail during operation or to be inoperative upon initial use of the chip. Again, in embodiments where only known-good Blocks are placed in the RTE buffer set 1300, these failures can significantly reduce the number of Blocks that are placed within the RTE buffer set 1300 for a given Lane and/or given Plane.

It should be understood that, as used herein, the failure of a chip or the failure of a portion of a chip can include both the actual failure of a chip or the occurrence of a situation indicating an anticipated or predicted failure of a chip or a portion of a chip.

Still further, the manner in which data is written to and/or read from the memory array can create conditions under which it is difficult to identify groups of Blocks in the RTE buffer set 1110 meeting the preferred conditions.

Under conditions as described above, where the preferred conditions for the selection of groups of Blocks in the RTE buffer set 1110 do not readily exist, the memory system 100 may operate to select groups of Blocks that, while not meeting the preferred conditions, meet a first reduced set of conditions that are appropriate for the operation of the system. For example, if the population of Blocks within the RTE buffer set 1300 is such that the system cannot, after a given amount of time or operational cycles, identify a group of Blocks meeting the preferred conditions, the system may determine whether a group of Blocks meeting another set of conditions can be identified. For example, if a group of Blocks cannot be identified where there is one Block associated with each Lane in the system, the system may determine whether a group of N Blocks can be identified from different Lanes, where N is one less than the total number of available Lanes. If such a group of Blocks can be identified that meets this first reduced set of conditions, the system can then associate that group of Blocks together as a location for storing Data Stripes, where the number of Pages in such Page Stripes is one less than the total number of Lanes in the system and ensure that ERASE operations are performed on the Blocks within that group.

If the population of the RTE Buffers is such that it is difficult or impossible for the system to identify groups of Blocks in the RTE buffer set 1300 meeting the first set of reduced conditions, the system could attempt to identify blocks meeting a second set of reduced conditions such, as for example, conditions where there are N' Blocks that can be identified, where N' is two less than the number of available Lanes. The operations using this second set of reduced conditions could follow those described above in connection with the first set of reduced conditions. Depending on the system, the system could look for groups meeting other sets of reduced conditions, if an inadequate number of groups of Blocks meeting the already presented sets of reduced conditions were identified.

In the embodiment described above, the operation of the system in terms of accepting and using groups of Blocks in the RTE buffer set 1300 meeting conditions other than the preferred conditions can be static or can vary depending on the operational state of the memory system 100. For example, during periods where there is little write activity occurring within the system, such that there is not a great need for a large number of available Page Stripe locations ready to receive data, the system 100 could operate under conditions where it waits to identify groups of Blocks meeting the preferred conditions before taking action. During periods where there was a large amount of write activity, such that there was a significant need for available Page Stripe locations, the system could more readily process groups of Blocks meeting reduced criteria. Still alternate embodiments are envisioned where the system 100 would be willing to accept groups meeting reduced criteria until a desired inventory of available Page Stripe locations were assembled and thereafter, as long as the inventory was at or near the desired inventory, utilize the preferred criteria. In such embodiments, the desired inventory count could be static or variable depending on the write activity of the system 100.

It should be noted that the system and methods described above can result in operation of the system 100 where the data stored in the memory array 14 is stored in Page Stripes having different numbers of Pages and, therefore, different amounts of stored data and different data protection information. For example, if the operation of the system described above resulted in some Page Stripes that include ten pages and others with nine pages, there would be differences between the amounts of data stored within the Page Stripes (some would have nine Data Pages and others eight Data Pages) and also differences in the Data Protection mechanism used to protect the stored data (in one example some Data Stripes would have data protected using data protection information obtained by XORing data from nine Pages of data, while others would use data protection information obtained by XORing data from eight Pages of data.

Exemplary READ Operations

Having described how WRITE operations may be accomplished using the memory system 100 disclosed here, and how move operations may be made to move valid data from one Block that is to be erased to another Block, a general discussion of the manner in which READ operations is performed shall be provided.

In general, a READ operation is performed when the FLASH controller 10 receives a READ request from an external host device. In general, the READ request will comprise a request from a host device to READ a Page of data associated with a particular LBA provided by the host device. To perform a READ operation, the Flash Controller will, in one embodiment:

(i) look up the LBA in the Logical-to-Physical translation table to identify the particular physical address where the Page storing the requested data is located;

(ii) issue a READ request to read the Page of stored data at the physical location corresponding to the requested LBA;

(iii) validate and, if necessary, correct or reconstruct the requested data using the ECC data and/or the information in the Data Protection Page for the Page Stripe corresponding to the requested LBA; and (iv) provide the host device with the retrieved Page of data.

The order of operations set out above is exemplary and embodiments are envisioned where the order is different from that set out above. For example, embodiments are envisioned wherein steps (iii) and (iv) are interchanged and the data would be provided to the host device followed by an indication of whether the data was valid or not.

In one embodiment, this reading of data is done on a Page specific basis, where the Page of data that is retrieved corresponds to the Page of data associated with the LBA provided by the host device. However, if the Page of data retrieved as a result of the READ operation is determined to be corrupted to a point that it can not be corrected through intra-Page ECC and/or CRC (or if the page is determined to have failed or be unreadable for any reason) then all of the Data Pages and the Data Protection Page for the Page Stripe in which that Page resides may be read and used to reconstruct the data within the Page associated with the LBA provided by the host device.

Response to Chip or Intra-Chip Failures

Because the system described above will: (a) check the validity of the data in each retrieved Page of data using the ECC and CRC data for that page; and (b) if necessary, use the Data Protection Page information within the Page Stripe where the Page is found to identify and correct Page failures or corruptions that can not be corrected through ECC, it is possible to identify data errors within the Pages that make up a Page Stripe. Such data errors can take the form of "soft" errors or "hard" errors. In general, a soft error is induced by transient events that cause one or more bits of data to be corrupted but that is not indicative of a physical problem with a specific FLASH memory storage cell (or groups of cells). True soft errors are substantially random and are typically not uniquely associated with any specific Pages, Blocks or other physical regions of the memory array.

A hard error is a corruption of one or multiple bits of data that is caused by a physical aspect of the memory storage device. Hard errors can be caused by a variety of factors including, but not limited to, the physical failure of components within a given memory chip (such as the failure of a charge pump), the physical failure of an entire memory chip or the external support structures for that chip (e.g., the breaking of a power line or an address line to a chip); the physical failure of all or part of a chip as a result of excessive temperature, magnetic field, humidity, etc. In general, because hard errors are related to the physical structure of a memory system, hard errors are uniquely associated with a particular collection of memory chips, a particular memory chip, or specific physical regions within a chip (such as a Chip Enable region, Plane or Block).

As noted above, data errors can be detected during a READ operation through the use of the ECC and CRC data for each Page. In many instances, identified data errors can be corrected through the use of ECC algorithms and/or through the use of the Data Protection information (in the event that a single Page exhibits an uncorrectable error). In such instances the ECC or Data Protection information can be used to recreate the corrupted data bit or bits, the recreated data can be placed within a new Page Stripe along with other Pages from the original stripe; and the new Page Stripe can be written back to the physical memory using the corrected data.

In certain embodiments, the memory system 100 will maintain records of the identified data errors and the physical structure associated with those errors. For example, in one embodiment, the memory system 100, and in particular the FLASH controller 10, will maintain records reflecting the number of errors associated with the various Blocks, Planes and, potentially, Chip Enables and Chips within the system. When these counts show that the number of errors associated with a given Block, Plane, Chip Enable or Chip are above a predetermined threshold, they can indicate that there has been a failure of a given memory chip or of a given region within the chip (i.e., a given Chip Enable, Plane or Block within a chip). Under such circumstances, the memory system 100 can designate the Chip (or intra-chip) region as bad or failed by designating the Blocks within the chip or region as bad. In that embodiment, the Blocks that are identified as bad will no longer be used by the memory system for the storage of data. This can be accomplished by, for example: (i) not placing the bad Blocks into the RTE Buffer, such that they are not used in the construction of Free Block Stripes and, therefore, would not be used in a Page Stripe for the storage of data or (ii) continuing to place the bad Blocks into the RTE buffer, but doing so under conditions where the blocks are identified as bad.

In the embodiment where the bad Blocks are placed into the RTE buffer, an indication would be provided so that the system 100 could use that information when assembling Free Block Stripes. For example, if there were ten blocks that were in the RTE buffer that meet the conditions for being grouped together as a Block Stripe but one of the Blocks was a bad block, the system could then proceed to form a Block Stripe from the identified Blocks that would have ten Blocks, but would provide an indication as to the bad Block such that the Page Stripe format for that Block Stripe would only utilize the nine good Blocks.

The ability of the memory system 100 to identify a failed memory chip and/or failed region within a chip; designate the Blocks associated with the failed chip or region as bad and then adjust the format of the Page Stripes in response to the failed chip or region allows the system to adapt to chip or intra-chip failures in such a way that the overall operation of the memory system is extremely robust. FIGS. 14A-14D illustrate this point.

Figure 14A:
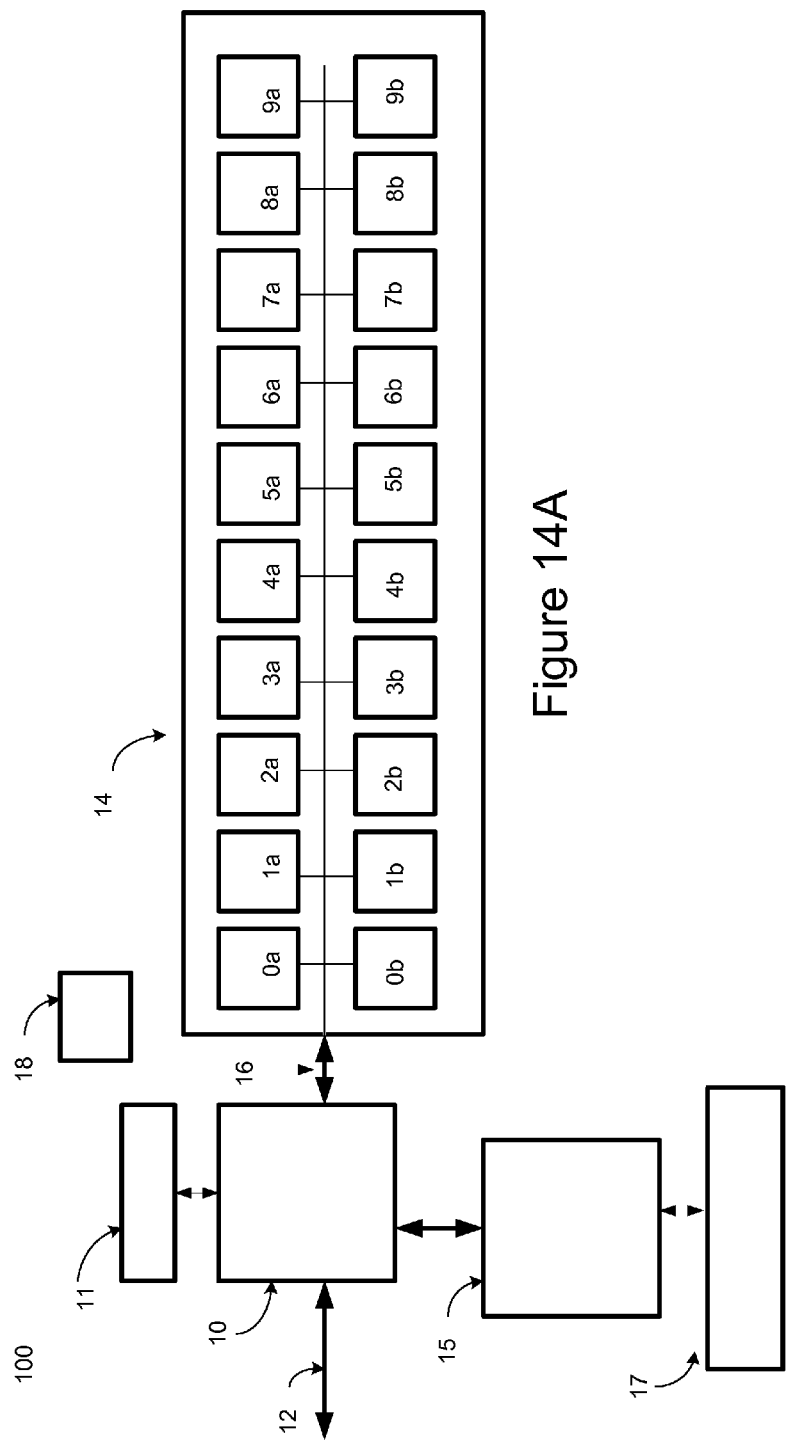
FIGS. 14A-14D illustrate another exemplary FLASH memory storage system and exemplary storage arrangement where memory chips that have failed are indicated as unavailable in accordance with the present disclosure.
Figure 14B:
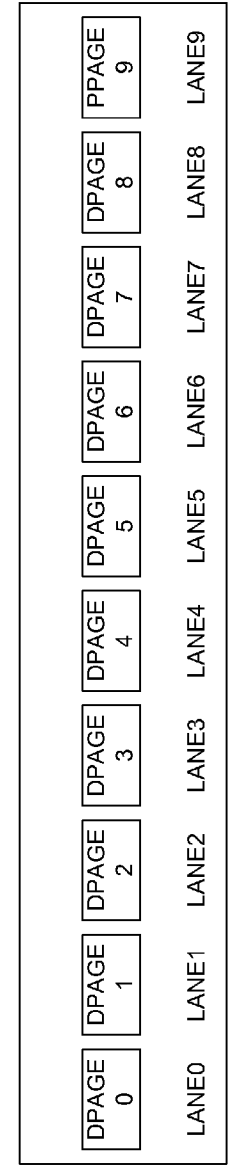

Referring to FIG. 14A, an exemplary memory system in accordance with aspects of the present disclosure is illustrated. Like the memory system 100 of FIG. 1, the memory system of FIG. 14A includes a FLASH controller 10, a CPU 15, and a memory array that includes ten Lanes, with each Lane including two memory chips. Assuming that all of the blocks within all of the chips are "good" blocks, the system could store data in the memory array using Page Stripes that are formatted such that each Page Stripe, or at least the majority of Page Stripes, includes a Page stored in each of the ten Lanes (e.g., a Page Stripe having nine Data Pages and one Data Protection Page). This is generally reflected in FIG. 14B which shows the standard Page Stripe format for the embodiment of FIG. 14A.

Figure 14C:
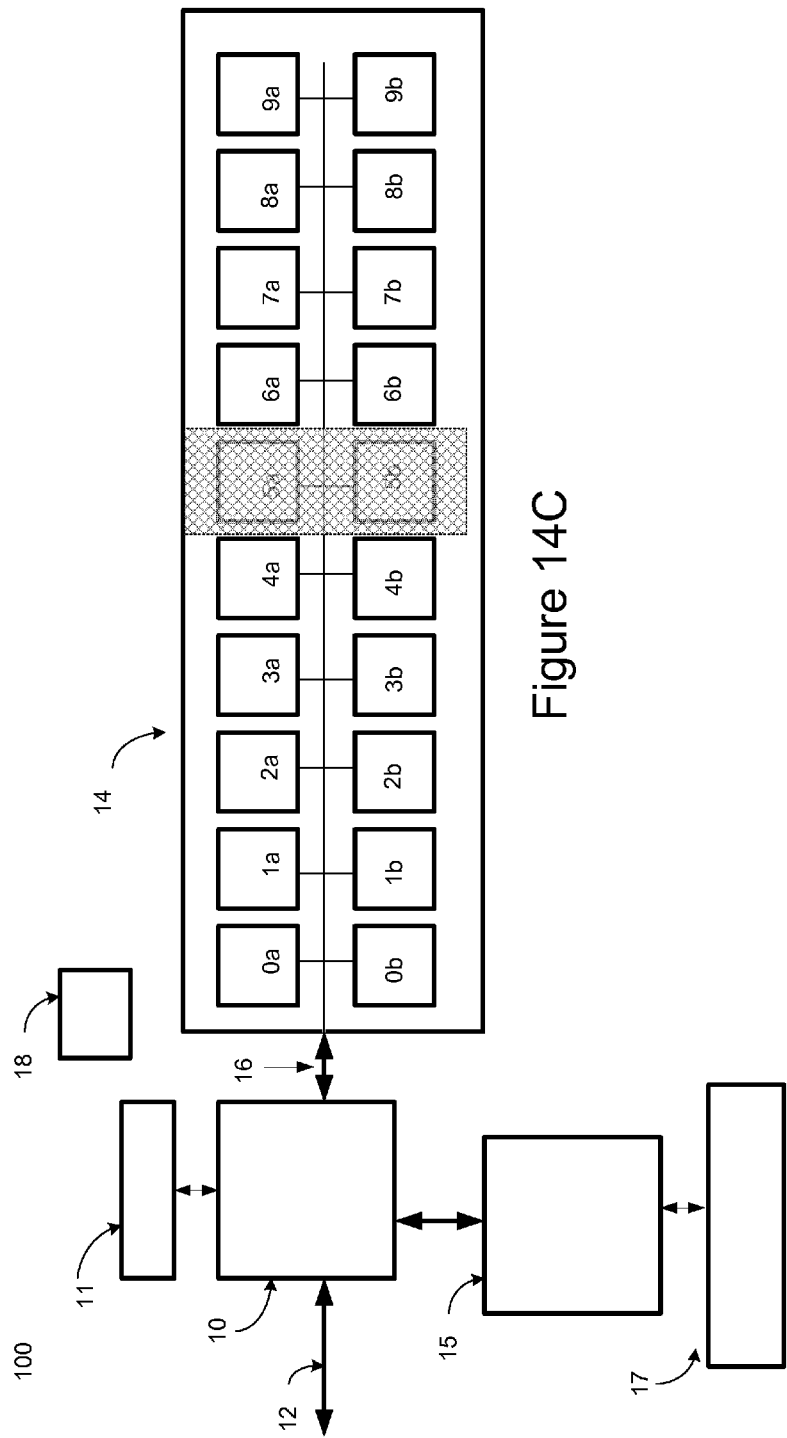
Figure 14D:
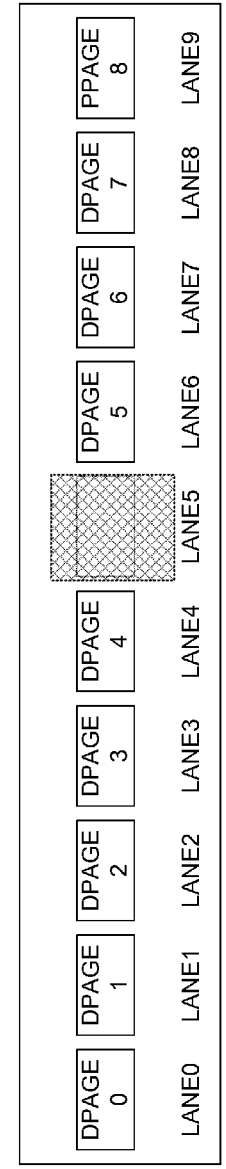

For purposes of the example of FIG. 14C, it is assumed that both of the memory chips associated with a given Lane fail and are no longer available to store data. In the illustrated example, it is assumed that the failure has occurred with respect to the chips in LANE5. This could occur, for example, as a result of a physical failure within the two chips or some damage being inflicted on the address or power lines to the chips in the Lane. Because of the nature of the described system 100, the failure of the chips in LANE5 would be detected and the system 100 could change the format of the Page Stripes that are used so that, as the system reads, writes and moves data, the data that was previously stored in physical locations across chips in all ten Lanes using a Page Stripe format with ten pages, is now stored across chips in only nine Lanes using a Page Stripe format with nine pages as reflected in FIG. 14D. Thus, in this embodiment, no data stored in the memory system 100 was lost, and the memory system 100 can self-adapt to the failure and continue to perform and operate by processing READ and WRITE requests from host devices. This ability of the described system to self-adapt automatically on the fly to chip and intra-chip failures makes the memory system disclosed herein extremely rugged and robust and capable of operating despite the failure of one or more chips or intra-chip regions. It also makes the system very user-friendly in that the failure of one, two or even more individual memory chips or devices does not require the removal and potential disposal of a previously used memory storage components.

It should be noted that the reconfiguration or reformatting of the data to change the Page Stripe formatting to account for chip or intra-chip failures may reduce the amount of physical memory space held in reserve by the system and available for the system for background operation. This reduction, however, is offset by the ability of the system to continue to operate properly in the event of a chip or Intra-chip failure.

Enhanced WRITE and READ Operations

In the examples described above, each READ or WRITE request issued by a host device will typically result in the performance of a READ or WRITE operation on locations within the physical memory array. While such operations can fulfill the operational goals of the memory system 100, they may not be optimal because: (i) the actual access of the physical memory array takes some amount of time (thus introducing some delay into the overall system operation) and (ii) the multiple accesses to the memory array tend to degrade the overall lifespan of chips that make up the physical array since FLASH memory chips used to form the physical memory array can be subjected to only a finite number of ERASE operations and the repeated access will resulted in increased ERASE operations.

An alternate embodiment of the memory system 100 of FIG. 1 utilizes methods and apparatus to improve the overall performance and lifespan of the system. This is accomplished by having the system monitor the incoming WRITE requests to assess the specific data that the host device seeks to write to the memory system.

It has been discovered that many host devices issue a large number of WRITE commands that request the memory system 100 to write the same data string to the memory array. For example, experience has shown that it is not uncommon for a host device to issue a large number of WRITE commands requesting the memory system to write data consisting of all logical 0's to various LBA addresses or a large number of WRITE commands requesting the memory system to write data consisting of all logical 1's to various LBA addresses. It has also been discovered that, in various applications, it is not uncommon for a host device to issue a large number of WRITE commands requesting that a specific data string be written to various LBA addresses. This could occur, for example, where the host device was asking the memory system to store data associated with a specific physical measurement, for example the flow rate through a specific orifice. In such situations, if the physical parameter corresponding to the data was relatively constant (e.g., if the flow rate was constant) the host device would likely request that the same data (reflecting measurement of the parameter at different times) be stored at different LBA addresses.

To increase the performance of the overall memory system, the embodiment described herein utilizes hardware or a software process that first considered, for each WRITE request, whether the data associated with that WRITE requests meets one of a number of predefined criteria. For example, the system could use hardware to determine if the data associated with the WRITE request consisted of all logical 1's or all logical 0's. If it were determined that the data associated with the WRITE request was within one of these predetermined categories, then the memory system would not write the data to the memory array, but would rather take an alternate course as described below.

In the alternate course, the memory system 100 would create an entry in the Logical-to-Physical Translation table (LPT) that associated the LBA provided by the host device with a specific Data Identifier. The Data Identifier would: (a) have the general format of the physical memory address identifier stored in the LPT when the LBA in the table is associated with data actually stored in memory, but (b) would not correspond to any specific physical address in the physical memory array. Instead, the Data Identifier would be associated by the system with a specific data string such that, for a given LBA entry, the presence of the Data Identifier would convey the data associated with the LBA, even though such data was not actually stored in a physical location within the memory array, and even though there was no actual physical memory location in the array associated with the LBA.

This aspect of the present disclosure is generally identified in FIGS. 15A-15B. For purposes of illustration, it is assumed that Data Identifiers have been predetermined that associate certain Data Identifier information with certain data strings. In the illustrated example, the Data Identifier FFFFF is associated with a data string of all logical 0's; the Data Identifier FFFFE with all logical 1's; and the Data Identifier FFFFD with alternating logical 0's and 1's (beginning with a logical 1). This is reflected in the Table in FIG. 15A.

FIG. 15B illustrates an exemplary LPT that has multiple entries, each entry being associated with a specific LBA. In the illustrated example, the addressing of the table is such that an LPT entry is associated with each LBA address presented by the memory system.

FIG. 15B illustrates the situation that would exist if a WRITE operation is requested where the data associated with the request is all logical 0's and the WRITE request was directed to the LBA address 55. As reflected in this example, the system would, before executing the WRITE request, analyze the data associated with the request, and determine that it was all logical 0's. This could be done through software analysis of the data or through the use of a hardware component, such as a comparator or large AND or OR device. Once it was determined that the data was all logical 0's, the system would—instead of actually storing data in the memory array—discard the data provided by the host device and store the Data Identifier associated with that data string in the LPT location that would normally store the physical address where the data associated with the corresponding LBA was located.

FIG. 15B illustrates the situation that would exist if a subsequent WRITE operation occurred where the WRITE was directed to LBA 500 with the data being all logical 0's. Here, the system would, using the approaches described above, determine that the data was all 0's, discard the data provided by the host device, and write the Data Identifier associated with the all 0's string to the entry in the LPT associated with the LBA 500. Note that in this example, the entries for both the LBA 55 and LBA 500 would have the same Data Identifier.

The same process would be followed for WRITE operations associated with data strings corresponding to other predefined Data Identifiers.

In terms of the WRITE operation, the use of the Data Identifiers as described above is beneficial because it does not result in the actual writing of data to the physical memory array and does not suffer the write overhead (time delay) that would occur if an actual write operation occurred. In one embodiment, the LPT table is stored in RAM memory and in particular, DDR2 RAM memory. In general, the access times required for RAM memory access are faster than those required for FLASH memory access. Thus, by eliminating the need to actually access the FLASH-based memory array, the use of Data Identifiers can substantially increase the time seen by the host device for the performance of a write operation. Also, by eliminating the need to actually access the FLASH memory array, the total number of ERASE operations can be reduced and the lifespan of the memory array increased.

The use of Data Identifiers also has an impact on READ operations. Specifically, when a READ operation is attempted for an LBA having an associated Data Identifier, the system 100 will determine that the access is to such an LBA and, instead of accessing an actual physical memory location within the FLASH memory array, will return the data string associated with the Data Identifier. Depending on the mechanism used to provide the associated data string, the overall READ times seen by the host device can be decreased relative to what would have been seen had an actual access of the FLASH memory array been required.

In the examples of FIGS. 15A-15B, the Data Identifiers were predefined to correspond to specific anticipated data strings. Alternate embodiments are envisioned where some of the Data Identifiers are not predefined to be associated with specific data strings, but are rather constructed by the system 100 in response to the actual operation of the system For example, in some embodiments the system 100 can include a process that runs in the background during relatively idle time, where the data actually stored in the memory array is considered. In this embodiment, if the analysis indicates that there are a sufficiently large number of data entries in the memory array corresponding to the same data string, the system would then define a Data Identifier as being associated with that specific data string and would modify the corresponding LPT entries. This process not only could speed up READ and WRITE requests as described above, it could also free up memory space within the memory array that would otherwise be used to store such repetitive data, thus providing more available physical memory and improving the overall operation of the system.

In an alternate embodiment, the system 100 can include a running Data String Cache memory that associates a Data Identifier with each of the most recent data strings associated with the last N number of WRITE operations (where N is a predefined number). In this embodiment, if a subsequent WRITE operation uses a data string associated with an entry in the Data String Cache, the Data Identifier will be used for that entry. A count can be maintained of the number of times a hit occurs for the entries in the Data String Cache. If it is determined that an entry has no, or an insufficient number of Hits, then the particular entry can be deleted from the cache, the corresponding data string actually stored in physical memory and a physical memory location for each of the corresponding LBAs in the LPT table, and another data string entry can be placed in the Data String Cache.

The above embodiments are illustrative and not limiting. Other and further embodiments utilizing one or more aspects of the inventions described above can be devised without departing from the spirit of Applicant's invention.

Further, the order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to protect fully all such modifications and improvements.

What is claimed is:

1. A memory system comprising:

a plurality of FLASH memory chips, each of the plurality of FLASH memory chips having substantially the same physical construction and being associated with a plurality of physical memory locations, each having a physical memory address, the physical memory locations of each FLASH memory chip being grouped together to form blocks and planes, wherein a block reflects a group of FLASH memory locations that are erased at the same time and a plane reflects a group of blocks that utilize common circuitry for the performance of memory access operations;

a system controller that includes an external communication bus interface for receiving WRITE requests from an external host device, wherein each WRITE request includes a data item and a logical memory address associated with the data item, the system controller further comprising a plurality of internal communication bus interfaces, each allowing the system controller to write data into physical memory locations associated with one or more of the FLASH memory chips; and a plurality of internal data communication buses, each internal data communications bus coupling one or more of the FLASH memory chips to an internal communication bus interface of the system controller;

wherein the system controller is configured to associate each physical memory address with status data indicating whether the data stored at the physical memory address is invalid data;

wherein the system controller is configured, for each WRITE request, to:

(1) determine whether the logical memory address associated with the received data item was previously associated with a physical memory address;

(2) if the logical memory address was previously associated with a physical memory address, change the status data for the previously associated physical memory address to indicate that the previously stored data is no longer valid;

(3) identify an available physical memory location where the received data can be stored that is different from the previously associated physical memory address, the controller identifying the available physical memory location from at least one free blocks buffer, the at least one free blocks buffer containing one or more free blocks entries, each entry identifying a group of free blocks that have been defined by the controller as a free blocks group, each free blocks group having been previously erased and ready for storage of data, each block within a free blocks group storing one data item within a group of associated data items such that the number of blocks in a free blocks group equals the number of data items within a group of associated data items;

(4) write the received data into the identified available physical memory address; and (5) update a table to associate the received logical memory address with the identified available physical memory address so as to translate the logical memory address provided by the external host to a physical memory address and to write the data item provided as part of the WRITE request to the physical memory location corresponding to the physical memory address;

wherein the system controller is further configured to:

(a) detect data errors that occur as a result of READ operations and maintain records of identified data errors and the plane associated with each data error;

(b) designate a plane within a given FLASH memory chip as bad whenever the number of detected data errors associated with that plane exceeds a predetermined number; and wherein the system controller is further configured to:

(i) associate a number of data items received through a plurality of WRITE requests with each other to form a group of received data items;

(ii) generate data protection information for each group and write the data protection information to a physical memory location;

(iii) perform the translation of the received logical memory addresses for the data items in the group and select the physical memory location for storage of the data protection information such that each of the data items is stored in a physical memory location within a FLASH memory chip that is different from the FLASH memory chips in which the other data items and the data protection information for the group of received data items are stored and such that each physical memory location of each data item within the group of data items is within a plane in the FLASH memory chip in which it is stored that physically corresponds to the planes in which the physical memory locations where the other data items in the group are stored; and (iv) dynamically select the number of data items used to form each group to not use any memory locations within the plane of the given FLASH memory chip that are designated as bad, such that the number of data items in one group of received data items differs from the number of data items in a second group of received data items such that the one group has a data item stored in physical memory locations within corresponding planes of each of the FLASH memory chips and such that the second group has a data item stored in corresponding planes of each of the FLASH memory chips except for the corresponding plane of the given FLASH memory chip which was designated as bad.

2. The memory system of claim 1 wherein the system controller is configured to designate a plane within the given FLASH chip as bad whenever the number of detected data errors associated with that plane exceeds a predetermined number based on information reflecting the actual or predicted failure of the plane within the given FLASH memory chip.

3. The memory system of claim 1 wherein the system controller is further configured to dynamically select the number of data items used to form each group based on the number of data items received from an external host over a defined time period.

4. The memory system of claim 1 wherein the system controller is further configured to dynamically select the number of data items used to form each group based on the number of memory locations within the FLASH memory chips that are available for the storage of data at the time the data items are associated with each other to form the group.

5. The memory system of claim 1 wherein the system controller is configured to dynamically select the number of data items used such that the maximum number of data items within a group is ten or less.

6. The memory system of claim 1 wherein each of the FLASH memory chips is mounted on the same printed circuit board as the other flash memory chips.

7. The memory system of claim 1 wherein the at least one free blocks buffer includes a first entry and a second entry, the first entry identifying a first free blocks group having a first number of blocks and the second entry identifying a second free blocks group having a second number of blocks that is different from the first number of blocks.

8. The memory system of claim 1 wherein the at least one free blocks buffer includes a first free blocks buffer and a second free blocks buffer, the first free blocks buffer containing entries that identify free blocks groups having a first number of blocks and the second free blocks buffer containing entries that identify free blocks groups having a second number of blocks that is different from the first number of blocks.

9. A memory system comprising:
a plurality of FLASH memory chips, each of the plurality of FLASH memory chips having substantially the same physical construction and being associated with a plurality of physical memory locations, each having a physical memory address, the physical memory locations of each FLASH memory chip being grouped together to form blocks and planes, wherein a block reflects a group of FLASH memory locations that are erased at the same time and a plane reflects a group of blocks that utilize common circuitry for the performance of memory access operations;
a system controller that includes an external communication bus interface for receiving WRITE requests from an external host device, wherein each WRITE request includes a data item and a logical memory address associated with the data item, the system controller further comprising a plurality of internal communication bus interfaces, each allowing the system controller to write data into physical memory locations associated with one or more of the FLASH memory chips; and
a plurality of internal data communication buses, each internal data communications bus coupling one or more of the FLASH memory chips to an internal communication bus interface of the system controller;
wherein the system controller is configured, for each WRITE request, to translate the logical memory address provided by the external host to a physical memory address and to write the data item provided as part of the WRITE request to the physical memory location corresponding to the physical memory address;
wherein the system controller is further configured to:
(a) detect data errors that occur as a result of READ operations and maintain records of identified data errors and the block associated with each data error;
(b) designate a block within a given FLASH chip as bad whenever the number of detected data errors associated with that block exceeds a predetermined number; and
wherein the system controller is further configured to:
(i) associate a number of data items received through a plurality of WRITE requests with each other to form a group of received data items;
(ii) generate data protection information for each group and write the data protection information to a physical memory location;
(iii) perform the translation of the received logical memory addresses for the data items in the group and select the physical memory location for storage of the data protection information such that each of the data items is stored in a physical memory location within a FLASH memory chip that is different from the FLASH memory chips in which the other data items and the data protection information for the group of received data items are stored and such that each physical memory location of each data item within the group of data items is within a plane in the FLASH memory chip in which it is stored that physically corresponds to the planes in which the physical memory locations where the other data items in the group are stored;
(iv) dynamically select the number of data items used to form each group to not use any physical memory locations within the block of the given FLASH memory chip that are designated as bad, such that the number of data items in one group of received data items differs from the number of data items in a second group of received data items such that the one group has a data item stored in physical memory locations within blocks within corresponding planes of each of the FLASH memory chips and such that the second group has a data item stored in blocks of corresponding planes of each of the FLASH memory chips except for the corresponding plane of the given FLASH memory chip which contains the block designated as bad; and
(v) identify an available physical memory location for the group of received data items, the controller identifying the available physical memory location from at least one free blocks buffer, the at least one free blocks buffer containing one or more free blocks entries, each entry identifying a group of free blocks that have been defined by the controller as a free blocks group, each free blocks group having been previously erased and ready for storage of data, each block within a free blocks group storing one data item within a group of associated data items such that the number of blocks in a free blocks group equals the number of data items within a group of associated data items.

10. The memory system of claim 9 wherein the controller is configured to populate the at least one free blocks buffer by:
- (i) monitoring the FLASH memory chips to identify blocks that are in condition to be erased;
- (ii) placing the identified blocks in one or more ready to erase buffers that store information concerning blocks that are ready to be erased;
- (iii) monitoring the ready to erase buffers to identify blocks that may be associated with one another to form a free blocks group;
- (iv) upon identifying blocks that may be associated with one another to form a free blocks group:
  - (a) move valid data from the identified blocks to other physical storage locations;
  - (b) erase the identified blocks after the valid data has been moved to other physical storage locations;
  - (c) associate the identified blocks with one another to form a free blocks group that is available for storage of data; and
  - (d) place information identifying the free blocks group in a free blocks entry of the at least one free blocks buffers.

11. The memory system of claim 10 wherein each group of two FLASH memory chips forms a Lane such that (i) each block in a ready to erase buffer is associated with a different lane; (ii) each block in the ready to erase buffer is associated with the same corresponding plane; and (iii) the number of blocks is equal to the number of lanes.

* * * * *